US012581662B2

(12) United States Patent
Noh et al.

(10) Patent No.: US 12,581,662 B2
(45) Date of Patent: Mar. 17, 2026

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Youngji Noh, Suwon-si (KR); Jongho Woo, Suwon-si (KR); Joo-Heon Kang, Suwon-si (KR); Myunghun Woo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 385 days.

(21) Appl. No.: 18/457,799

(22) Filed: Aug. 29, 2023

(65) Prior Publication Data

US 2024/0260280 A1 Aug. 1, 2024

(30) Foreign Application Priority Data

Jan. 27, 2023 (KR) ........................ 10-2023-0010908

(51) Int. Cl.
H10B 63/00 (2023.01)
(52) U.S. Cl.
CPC ........... H10B 63/845 (2023.02); H10B 63/34 (2023.02)
(58) Field of Classification Search
CPC ...... H10B 41/20; H10B 43/20; H10B 63/845; H10B 63/84; H10B 63/34
See application file for complete search history.

(56) References Cited

U.S. PATENT DOCUMENTS

| | | | |
|---|---|---|---|
| 6,891,259 B2 | 5/2005 | Im et al. | |
| 9,337,237 B2 | 5/2016 | Tang et al. | |
| 9,978,756 B2 | 5/2018 | Kim et al. | |
| 10,475,806 B2 | 11/2019 | Yagi et al. | |
| 10,566,345 B2 | 2/2020 | Kanamori et al. | |
| 11,114,375 B2 | 9/2021 | Lee et al. | |
| 2020/0235050 A1* | 7/2020 | Lee ........................ | H10B 43/27 |

FOREIGN PATENT DOCUMENTS

| | | |
|---|---|---|
| CN | 108807405 B | 10/2020 |
| KR | 10-0446290 B1 | 9/2004 |

* cited by examiner

*Primary Examiner* — Suberr L Chi
(74) *Attorney, Agent, or Firm* — Harness, Dickey & Pierce, P.L.C.

(57) ABSTRACT

A semiconductor device including a cell array structure on a semiconductor substrate, the cell array structure including an electrode structure including electrodes and insulating layers vertically and alternately stacked on the semiconductor substrate, and a vertical structure and a penetration contact plug penetrating the electrode structure may be provided. The vertical structure may include a first inner layer, a first outer layer, and a first intermediate layer, and the penetration contact plug may include a second inner layer, a second outer layer, and a second intermediate layer. The electrodes may include a doped semiconductor material, and the first and second outer layers may include the same material. The first and second intermediate layers may include the same material, and the first and second inner layers may include materials different from each other.

20 Claims, 36 Drawing Sheets

FIG. 11A

SEMICONDUCTOR DEVICE AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2023-0010908, filed on Jan. 27, 2023, in the Korean Intellectual Property Office, the entire contents of which are hereby incorporated by reference.

BACKGROUND

The present disclosure relates to semiconductor devices and electronic systems including the same.

A semiconductor device capable of storing a large amount of data is required as a part of an electronic system. Accordingly, many studies are being conducted to increase the data storage capacity of the semiconductor device. For example, semiconductor devices with three-dimensionally arranged memory cells are being suggested, instead of devices with two-dimensionally arranged memory cells.

SUMMARY

An example embodiment of the inventive concepts provides a semiconductor device with increased reliability and an increased integration density.

An example embodiment of the inventive concepts provides an electronic system including the semiconductor device.

An example embodiment of the inventive concepts provides a method of more easily fabricating a semiconductor device.

According to an example embodiment of the inventive concepts, a semiconductor device includes a semiconductor substrate and a cell array structure on the semiconductor substrate. The cell array structure includes an electrode structure including electrodes and insulating layers, the electrodes and the insulating layers vertically and alternately stacked with each other on the semiconductor substrate, a vertical structure penetrating the electrode structure, and a penetration contact plug penetrating the electrode structure and laterally spaced apart from the vertical structure. The vertical structure includes a first inner layer, a first outer layer enclosing the first inner layer, and a first intermediate layer interposed between the first inner layer and the first outer layer, and the penetration contact plug include a second inner layer, a second outer layer enclosing the second inner layer, and a second intermediate layer interposed between the second inner layer and the second outer layer. The electrodes includes a doped semiconductor material, and the first and second outer layers include a same material. The first and second intermediate layers include a same material, and the first and second inner layers include different materials from each other.

According to an example embodiment of the inventive concepts, a semiconductor device includes a semiconductor substrate including a cell array region and a connection region extending from the cell array region, a cell array structure on the semiconductor substrate, and a peripheral circuit structure interposed between the semiconductor substrate and the cell array structure. The cell array structure includes an electrode structure including electrodes and insulating layers, the electrodes and the insulating layers vertically and alternately stacked with each other on the peripheral circuit structure, each of the electrodes including a pad portion on the connection region, a vertical structure in the cell array region and penetrating the electrode structure, and a penetration contact plug in the connection region and penetrating the pad portion. The vertical structure includes a first inner layer and a first outer layer enclosing the first inner layer, and the penetration contact plug may include a second inner layer and a second outer layer enclosing the second inner layer. The electrodes includes a doped semiconductor material, and the first inner layer may include an insulating material. The second inner layer includes a metallic material, and the first and second outer layers include the same material. The second outer layer is in contact with the electrodes.

According to an example embodiment of the inventive concepts, an electronic system includes a three-dimensional semiconductor memory device including a semiconductor substrate including a cell array region and a connection region extended from the cell array region, a peripheral circuit structure on the semiconductor substrate, a cell array structure on the peripheral circuit structure, an insulating layer covering the cell array structure, and an input/output pad provided on the insulating layer and electrically connected to the peripheral circuit structure, and a controller electrically connected to the three-dimensional semiconductor memory device through the input/output pad and configured to control the three-dimensional semiconductor memory device. The cell array structure includes an electrode structure including electrodes and insulating layers, the electrodes and the insulating layers vertically and alternately stacked with each other on the peripheral circuit structure, a vertical structure penetrating the electrode structure, and a penetration contact plug penetrating the electrode structure and laterally spaced apart from the vertical structure. The vertical structure includes a first inner layer, a first outer layer enclosing the first inner layer, and a first intermediate layer interposed between the first inner layer and the first outer layer, and the penetration contact plug includes a second inner layer, a second outer layer enclosing the second inner layer, and a second intermediate layer interposed between the second inner layer and the second outer layer. The electrodes include a doped semiconductor material, and the first and second outer layers may include the same material. The first and second intermediate layers include the same material, and the first and second inner layers include different materials from each other.

BRIEF DESCRIPTION OF THE DRAWINGS

FIGS. 10A to 19A are sectional views, which are taken along the line A-A' of FIG. 5 to illustrate a method of fabricating a semiconductor device according to an example embodiment of the inventive concepts.

FIGS. 10B to 19B are sectional views, which are taken along the lines B-B' and C-C' of FIG. 5 to illustrate a method of fabricating a semiconductor device according to an example embodiment of the inventive concepts.

DETAILED DESCRIPTION

Example embodiments of the inventive concepts will now be described more fully with reference to the accompanying drawings, in which some example embodiments are shown.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

As used herein, expressions such as "at least one of," when preceding a list of elements, modify the entire list of elements and do not modify the individual elements of the list. Thus, for example, both "at least one of A, B, or C" and "at least one of A, B, and C" mean either A, B, C or any combination thereof. Likewise, A and/or B means A, B, or A and B.

Figure 1:
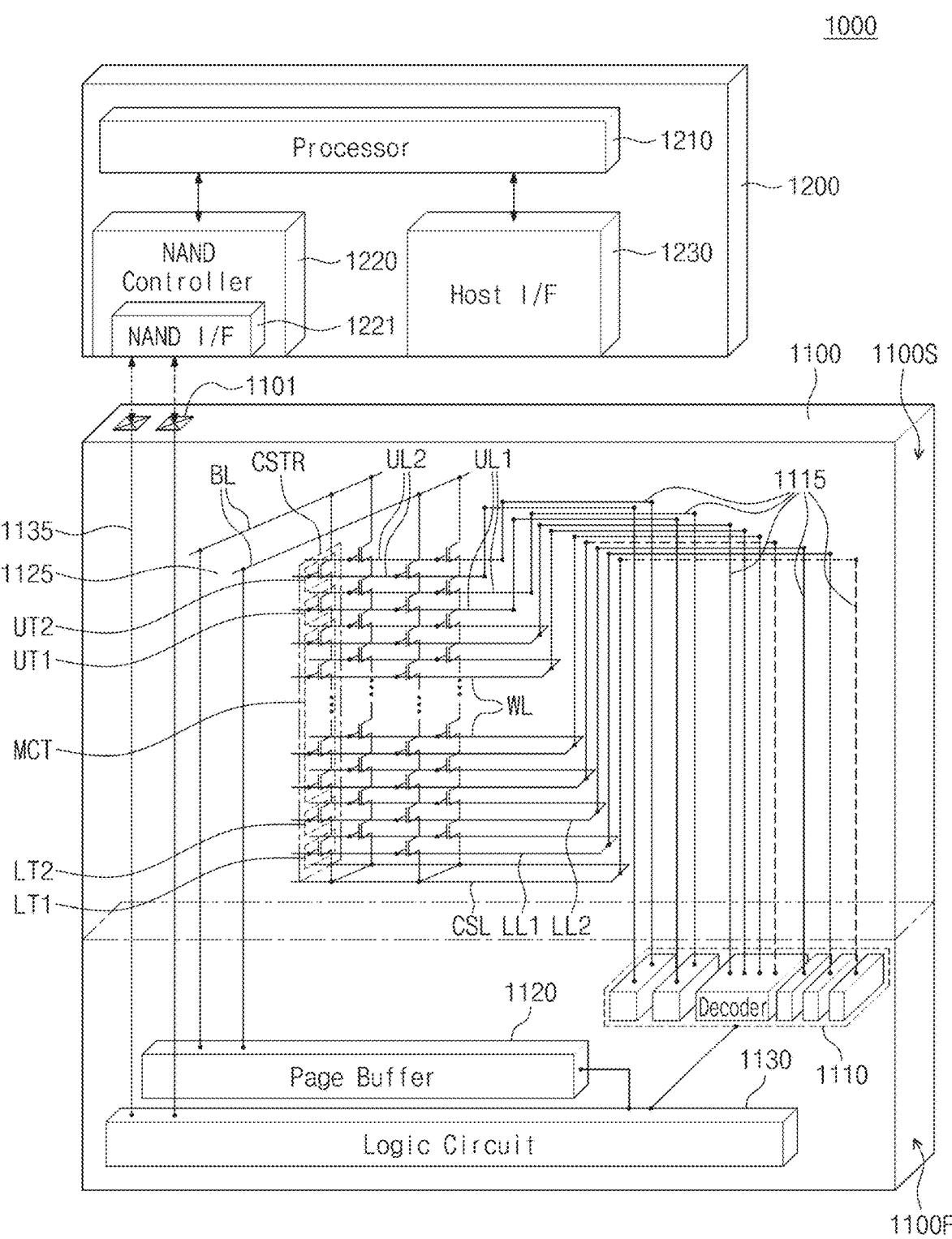
FIG. 1 is a diagram schematically illustrating an electronic system including a semiconductor device according to an example embodiment of the inventive concepts.

FIG. 1 is a diagram schematically illustrating an electronic system including a semiconductor device according to an example embodiment of the inventive concepts.

Referring to FIG. 1, an electronic system 1000 according to an example embodiment of the inventive concepts may include a semiconductor device 1100 and a controller 1200, which is electrically connected to the semiconductor device 1100. The electronic system 1000 may be a storage device, which includes one or more semiconductor devices 1100, or an electronic device including the storage device. For example, the electronic system 1000 may be a solid state drive (SSD) device, a universal serial bus (USB), a computing system, a medical system, or a communication system, in which at least one semiconductor device 1100 is provided.

The semiconductor device 1100 may be a nonvolatile memory device (e.g., a NAND FLASH memory device). The semiconductor device 1100 may include a first structure 1100F and a second structure 1100S on the first structure 1100F. In an example embodiment, the first structure 1100F may be disposed near the second structure 1100S.

The first structure 1100F may be a peripheral circuit structure, which includes a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed, according to example embodiments.

In an example embodiment, the upper transistors UT1 and UT2 may include at least one string selection transistor, and the lower transistors LT1 and LT2 may include at least one ground selection transistor. The gate lower lines LL1 and LL2 may be used as gate electrodes of the lower transistors LT1 and LT2, respectively. The word lines WL may be used as gate electrodes of the memory cell transistors MCT, and the gate upper lines UL1 and UL2 may be used as gate electrodes of the upper transistors UT1 and UT2, respectively.

In an example embodiment, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. At least one of the lower and upper erase control transistors LT1 and UT1 may be used to perform an erase operation of erasing data in the memory cell transistors MCT using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection lines 1115, which are extended from the first structure 1100F to the second structure 1100S. The bit lines BL may be electrically connected to the page buffer 1120 through second connection lines 1125, which are extended from the first structure 1100F to the second structure 1100S.

In the first structure 1100F, the decoder circuit 1110 and the page buffer 1120 may be configured to perform a control operation on at least one transistor that is selected from the memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135, which is provided in the first structure 1100F and is extended into the second structure 1100S.

The controller 1200 may include a processor 1210, a NAND controller 1220, and a host interface 1230. In an example embodiment, the electronic system 1000 may include a plurality of semiconductor devices 1100, and in this case, the controller 1200 may control the semiconductor devices 1100.

The processor 1210 may control overall operations of the electronic system 1000 including the controller 1200. The processor 1210 may be operated based on a specific firmware and may control the NAND controller 1220 to access the semiconductor device 1100. The NAND controller 1220 may include a NAND interface 1221, which is used to communicate with the semiconductor device 1100. The NAND interface 1221 may be used to transmit and receive control commands for controlling the semiconductor device 1100 and data to be written in or read from the memory cell transistors MCT of the semiconductor device 1100. The host interface 1230 may be configured to allow for communication between the electronic system 1000 and an external host. If a control command is received from an external host through the host interface 1230, the processor 1210 may control the semiconductor device 1100 in response to the control command.

Figure 2:
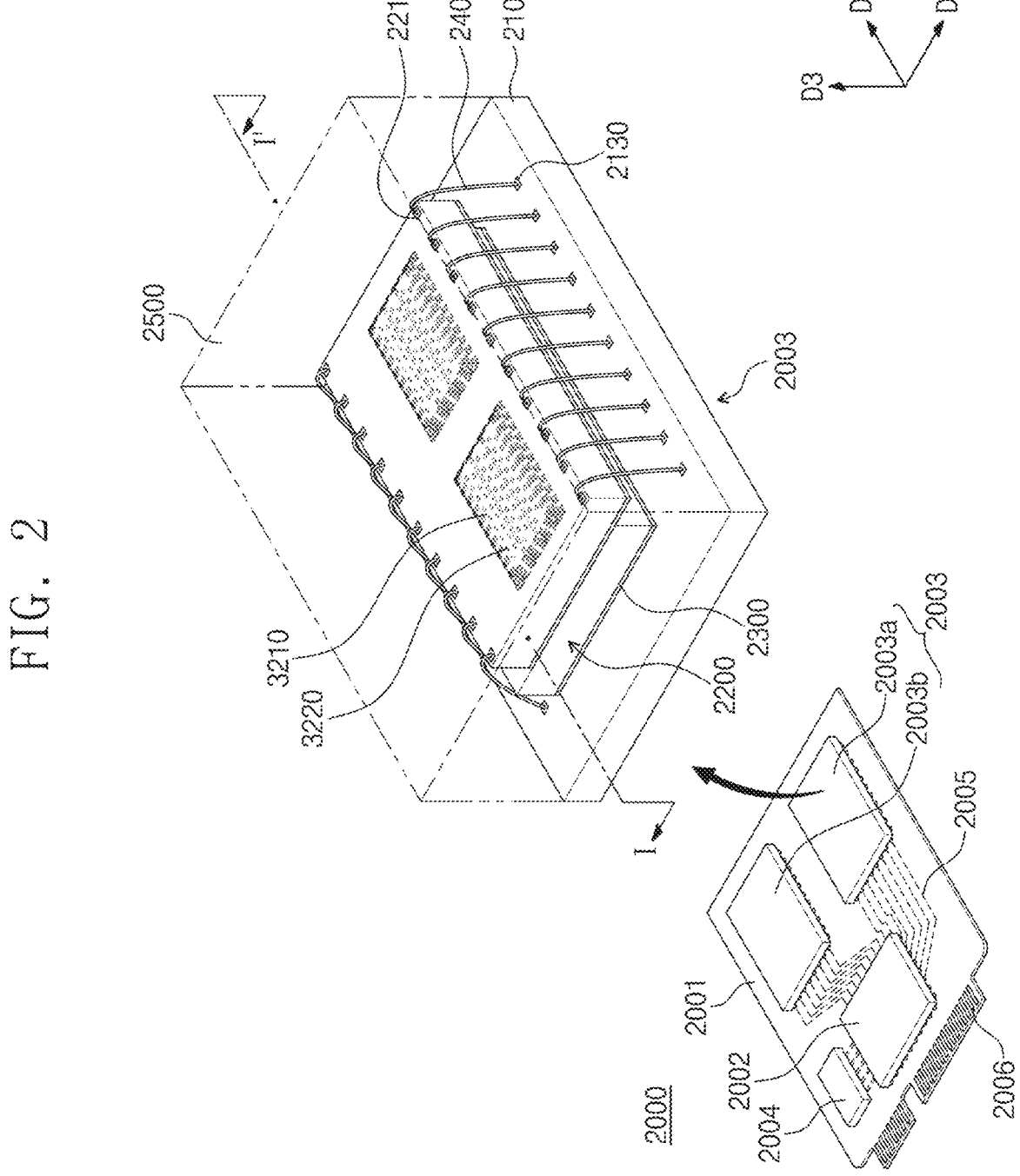
FIG. 2 is a perspective view schematically illustrating an electronic system including a semiconductor device, according to an example embodiment of the inventive concepts.

FIG. 2 is a perspective view schematically illustrating an electronic system including a semiconductor device according to an example embodiment of the inventive concepts.

Referring to FIG. 2, an electronic system 2000 according to an example embodiment of the inventive concepts may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 through interconnection patterns 2005, which are formed in the main substrate 2001.

The main substrate 2001 may include a connector 2006, which includes a plurality of pins coupled to an external host. In the connector 2006, the number and arrangement of the pins may depend on a communication interface between the electronic system 2000 and the external host. In an example embodiment, the electronic system 2000 may communicate with the external host, in accordance with one of interfaces, such as universal serial bus (USB), peripheral component interconnect express (PCI-Express), serial advanced technology attachment (SATA), universal flash storage (UFS) M-Phy, or the like. In an example embodiment, the electronic system 2000 may be driven by a power, which is supplied from the external host through the connector 2006. The electronic system 2000 may further include a power management integrated circuit (PMIC) that is configured to separately supply an electric power, which is supplied from the external host, to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory that is configured to relieve technical difficulties caused by a difference in speed between the semiconductor package 2003, which serves as a data storage device, and an external host. In an example embodiment, the DRAM 2004 in the electronic system 2000 may serve as a cache memory and may be used as a storage space, which is used to temporarily store data during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 respectively disposed on bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be a printed circuit board including upper pads 2130. Each of the semiconductor chips 2200 may include an input/output pad 2210. The input/output pad 2210 may correspond to the input/output pad 1101 of FIG. 1. Each of the semiconductor chips 2200 may include electrode structures 3210 and vertical structures 3220. Each of the semiconductor chips 2200 may include a semiconductor device, which will be described below, according to an example embodiment of the inventive concepts.

In an example embodiment, the connection structure 2400 may include a bonding wire electrically connecting the input/output pad 2210 to the upper pads 2130. Thus, in each of the first and second semiconductor packages 2003a and 2003b, the semiconductor chips 2200 may be electrically connected to each other in a bonding wire manner and may be electrically connected to the upper pads 2130 of the package substrate 2100. In an example embodiment, the semiconductor chips 2200 in each of the first and second semiconductor packages 2003a and 2003b may be electrically connected to each other by a connection structure including through silicon vias (TSVs), not by the connection structure 2400 provided in the form of bonding wires.

In an example embodiment, the controller 2002 and the semiconductor chips 2200 may be included in a single package. In an example embodiment, the controller 2002 and the semiconductor chips 2200 may be mounted on a separate interposer substrate, which is prepared regardless of the main substrate 2001, and may be connected to each other through interconnection lines, which are provided in the interposer substrate.

Figure 3:
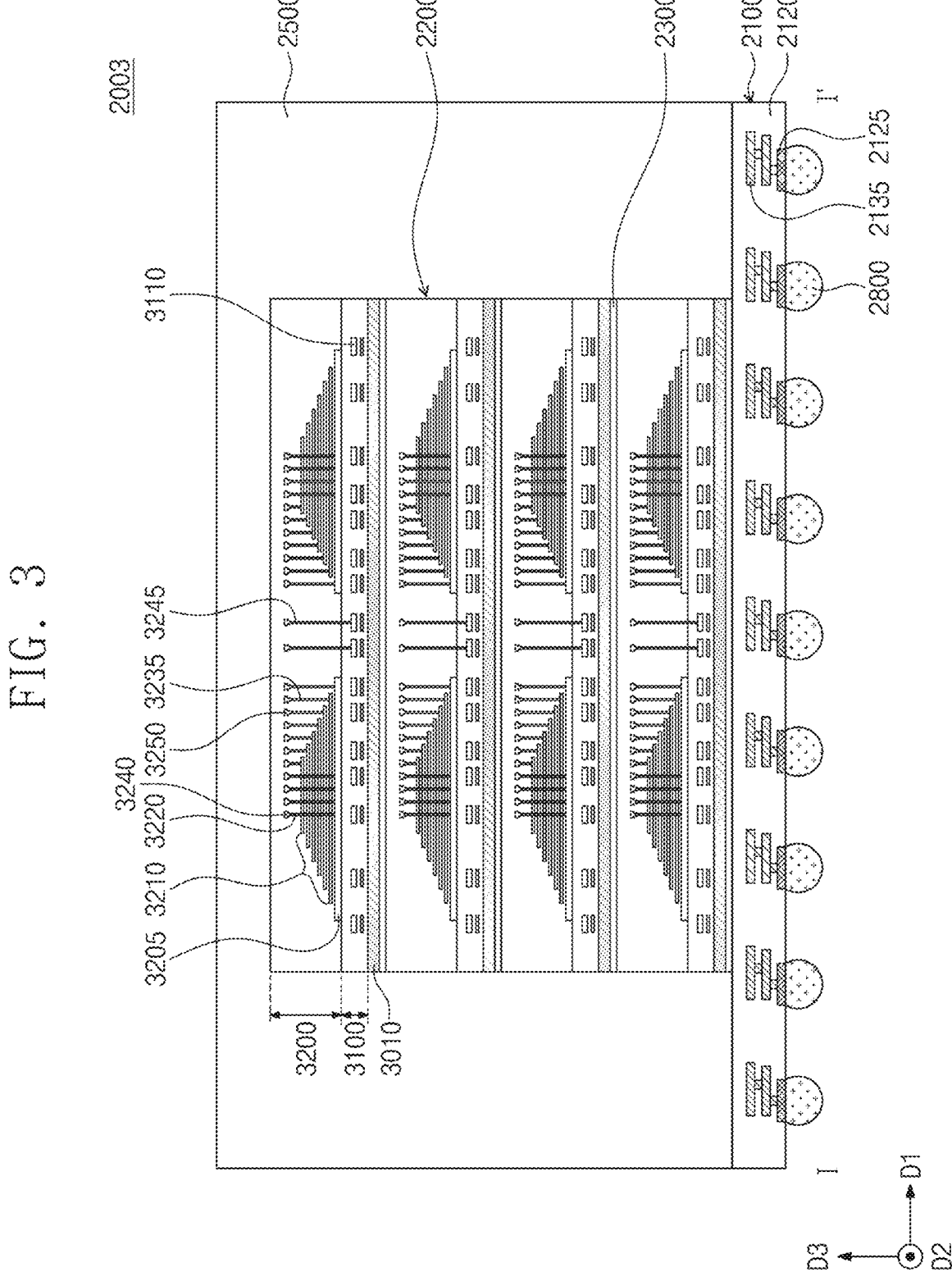
FIGS. 3 and 4 are sectional views, each of which schematically illustrates a semiconductor package according to some example embodiments of the inventive concepts.
Figure 4:
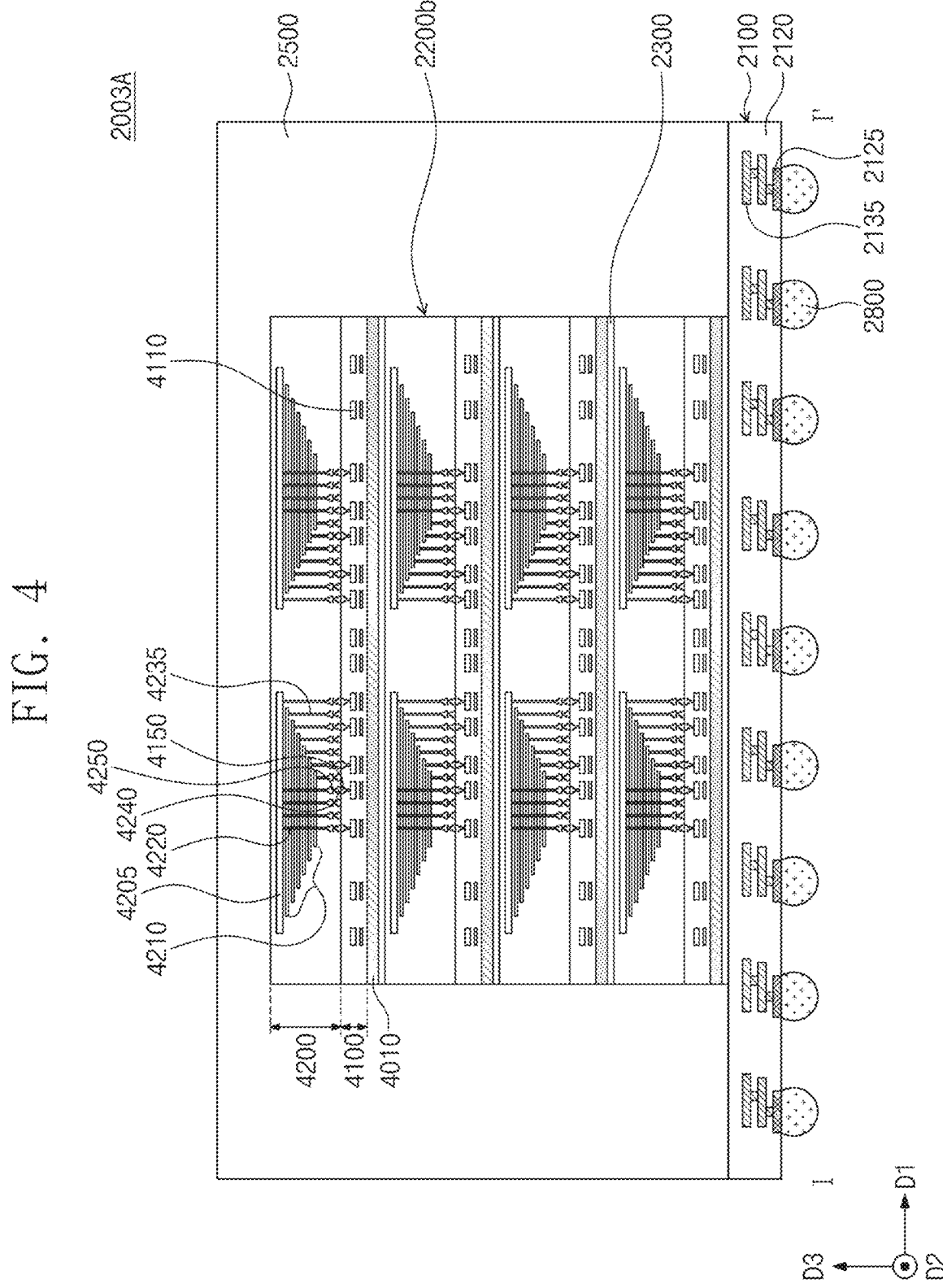

FIGS. 3 and 4 are sectional views schematically illustrating semiconductor packages according to some example embodiments of the inventive concepts. FIGS. 3 and 4 are sectional views, which are taken along a line I-I' of FIG. 2 to illustrate two different examples of the semiconductor package 2003 of FIG. 2.

Referring to FIG. 3, in the semiconductor package 2003, the package substrate 2100 may be a printed circuit board. The package substrate 2100 may include a package substrate body portion 2120, the upper pads 2130 (e.g., of FIG. 2), which are disposed on a top surface of the package substrate body portion 2120, lower pads 2125, which are disposed on or exposed through a bottom surface of the package substrate body portion 2120, and internal lines 2135, which are provided in the package substrate body portion 2120 to electrically connect the upper pads 2130 to the lower pads 2125. The upper pads 2130 may be electrically connected to the connection structures 2400. The lower pads 2125 may be connected to the interconnection patterns 2005 of the main substrate 2001 of the electronic system 2000 through conductive connecting portions 2800, as shown in FIG. 2.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a source structure 3205, an electrode structure 3210 on the source structure 3205, the vertical structures 3220 and separation structures penetrating the electrode structure 3210, bit lines 3240 electrically connected to the vertical structures 3220, and cell contact plugs 3235 electrically connected to the word lines WL (e.g., of FIG. 1) of the electrode structure 3210. Each of the first and second structures 3100 and 3200 and the semiconductor chips 2200 may further include a metal structure to be described below.

Each of the semiconductor chips 2200 may include penetration lines 3245, which are electrically connected to the peripheral lines 3110 of the first structure 3100 and are extended into the second structure 3200. The penetration line 3245 may be disposed outside the electrode structure 3210, and in an example embodiment, the penetration line 3245 may be provided to further penetrate the electrode structure 3210. Each of the semiconductor chips 2200 may further include the input/output pads 2210 (e.g., of FIG. 2), which are electrically connected to the peripheral lines 3110 of the first structure 3100.

Referring to FIG. 4, in a semiconductor package 2003A, each of the semiconductor chips 2200 may include a semiconductor substrate 4010, a first structure 4100 on the semiconductor substrate 4010, and a second structure 4200, which is provided on the first structure 4100 and is bonded with the first structure 4100 in a wafer bonding manner.

The first structure 4100 may include a peripheral circuit region, in which a peripheral line 4110 and first junction structures 4150 are provided. The second structure 4200 may include a source structure 4205, an electrode structure 4210 between the first structure 4100 and the source structure 4205, vertical structures 4220 and a separation structure penetrating the electrode structure 4210, and second junction structures 4250, which are electrically and respectively connected to the vertical structures 4220 and the word lines WL (e.g., see FIG. 1) of the electrode structure 4210. For example, the second junction structures 4250 may be electrically and respectively connected to the vertical structures 4220 and the word lines WL (e.g., of FIG. 1) through bit lines 4240, which are electrically connected to the vertical structures 4220, and cell contact plugs 4235, which are electrically connected to the word lines WL (e.g., of FIG. 1). The first junction structures 4150 of the first structure 4100 may be in contact with and bonded to the second junction structures 4250 of the second structure 4200. The bonded portions of the first and second junction structures 4150 and 4250 may be formed of or include, for example, copper (Cu).

Each of the first and second structures 4100 and 4200 and each of the semiconductor chips 2200a may further include a metal structure in some example embodiments to be described below. Each of the semiconductor chips 2200a may further include the input/output pad 2210 (e.g., see FIG. 2), which is electrically connected to the peripheral line 4110 of the first structure 4100.

The semiconductor chips 2200 of FIG. 3 or the semiconductor chips 2200a of FIG. 4 may be electrically connected to each other by the connection structures 2400, which are provided in the form of bonding wires. However, in an example embodiment, semiconductor chips, which are provided in the same semiconductor package as the semiconductor chips 2200 or 2200a of FIG. 3 or 4, may be electrically connected to each other by a connection structure including through silicon vias (TSVs).

The first structure 3100 or 410 of FIG. 3 or 4 may correspond to a peripheral circuit structure in an example embodiment to be described below, and the second structure 3200 or 420 of FIG. 3 or 4 may correspond to a cell array structure in an example embodiment to be described below.

Figure 5:
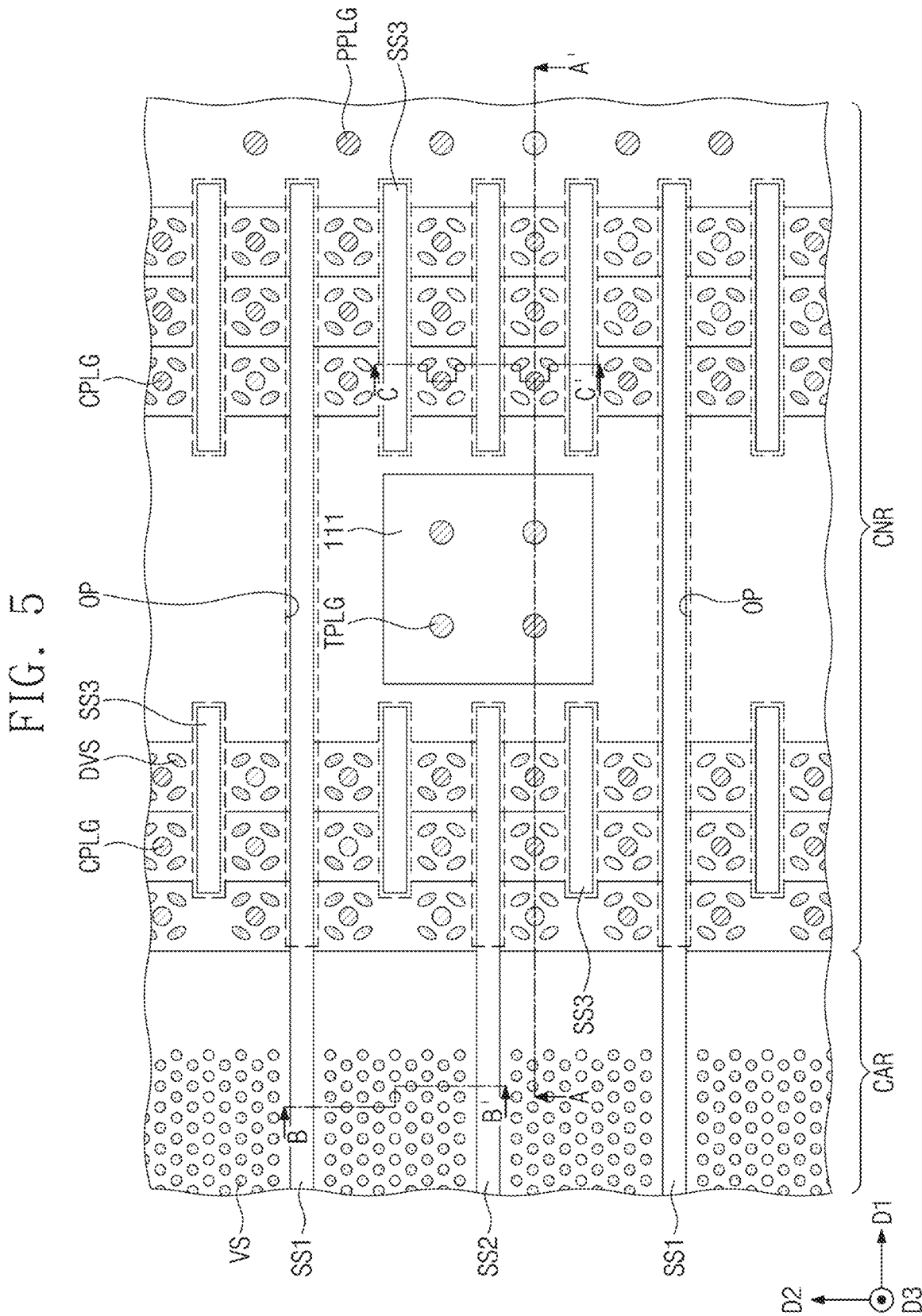
FIG. 5 is a plan view illustrating a semiconductor device according to an example embodiment of the inventive concepts.
Figure 6A:
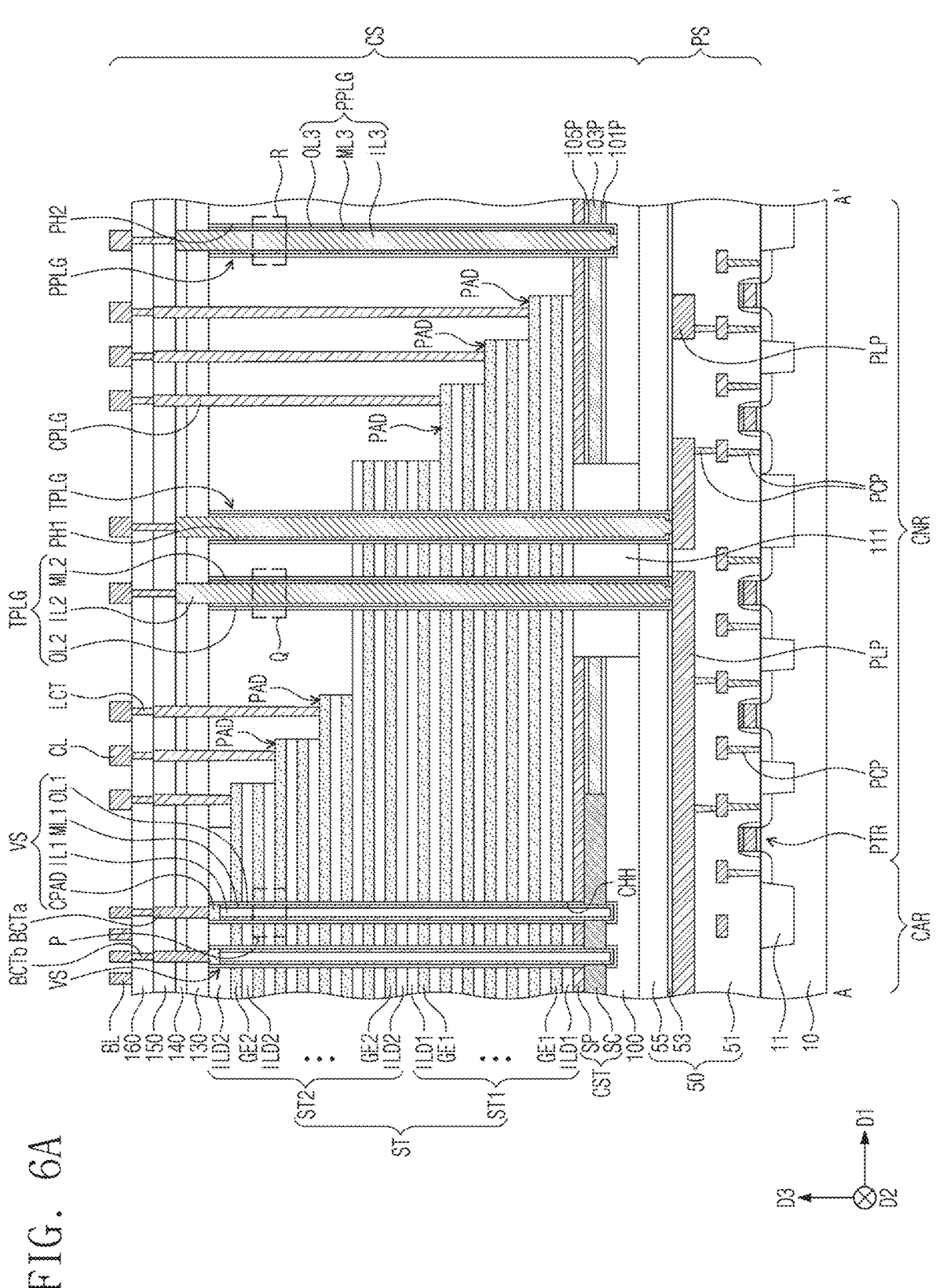
FIG. 6A is a sectional view, which is taken along a line A-A' of FIG. 5A to illustrate a semiconductor device according to an example embodiment of the inventive concepts.
Figure 6B:
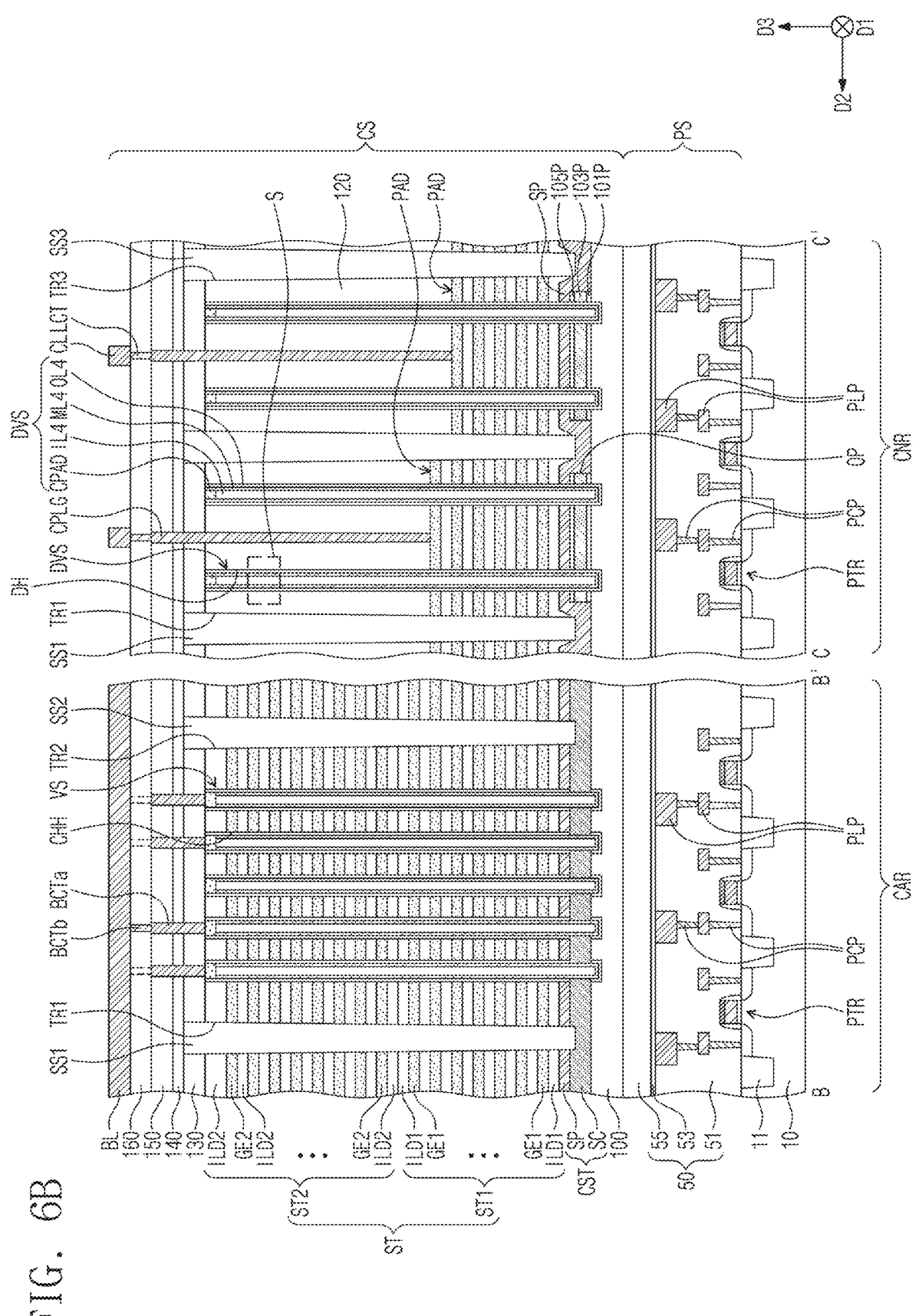
FIG. 6B is a sectional view, which is taken along lines B-B' and C-C' of FIG. 5A to illustrate a semiconductor device according to an example embodiment of the inventive concepts.

FIG. 5 is a plan view illustrating a semiconductor device according to an example embodiment of the inventive concepts. FIG. 6A is a sectional view, which is taken along a line A-A' of FIG. 5A to illustrate a semiconductor device according to an example embodiment of the inventive concepts. FIG. 6B is a sectional view, which is taken along lines B-B' and C-C' of FIG. 5A to illustrate a semiconductor device according to an example embodiment of the inventive concepts.

Figure 7A:
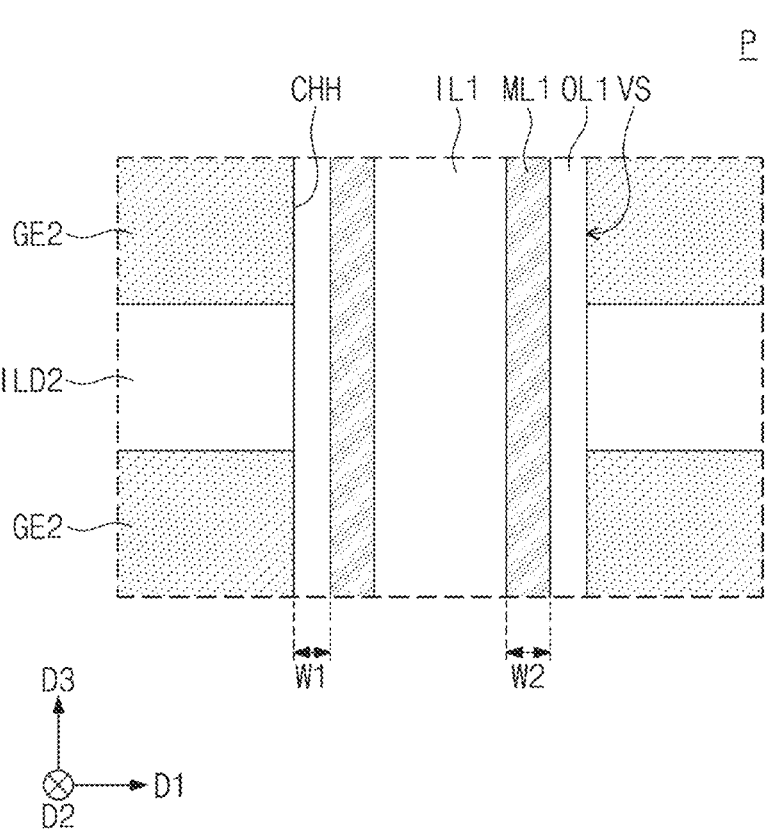
FIGS. 7A, 8A, and 9A are enlarged sectional views illustrating a portion 'P' of FIG. 6A.
Figure 7B:
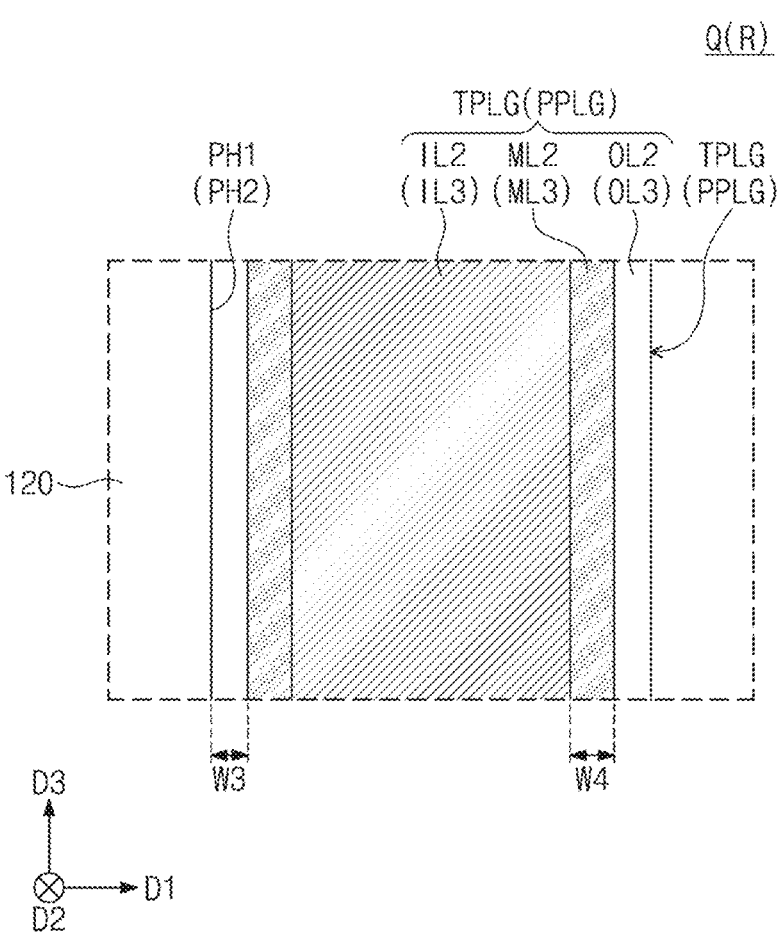
FIGS. 7B, 8B, and 9B are enlarged sectional views illustrating portions 'Q' and 'R' of FIG. 6A.
Figure 7C:
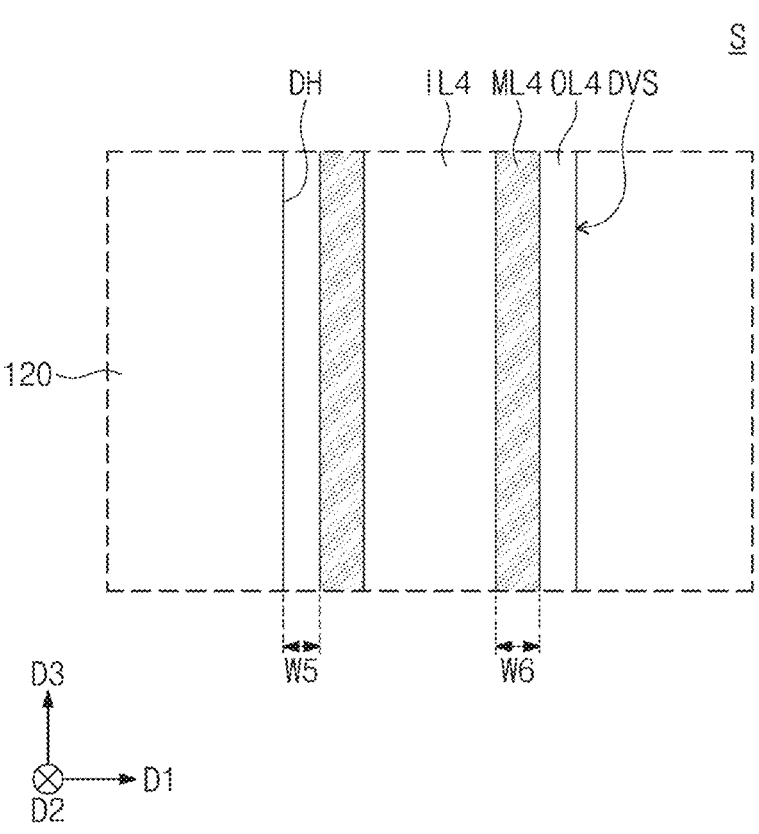
FIGS. 7C, 8C, and 9C are enlarged sectional views illustrating a portion 'S' of FIG. 6B.
Figure 8A:
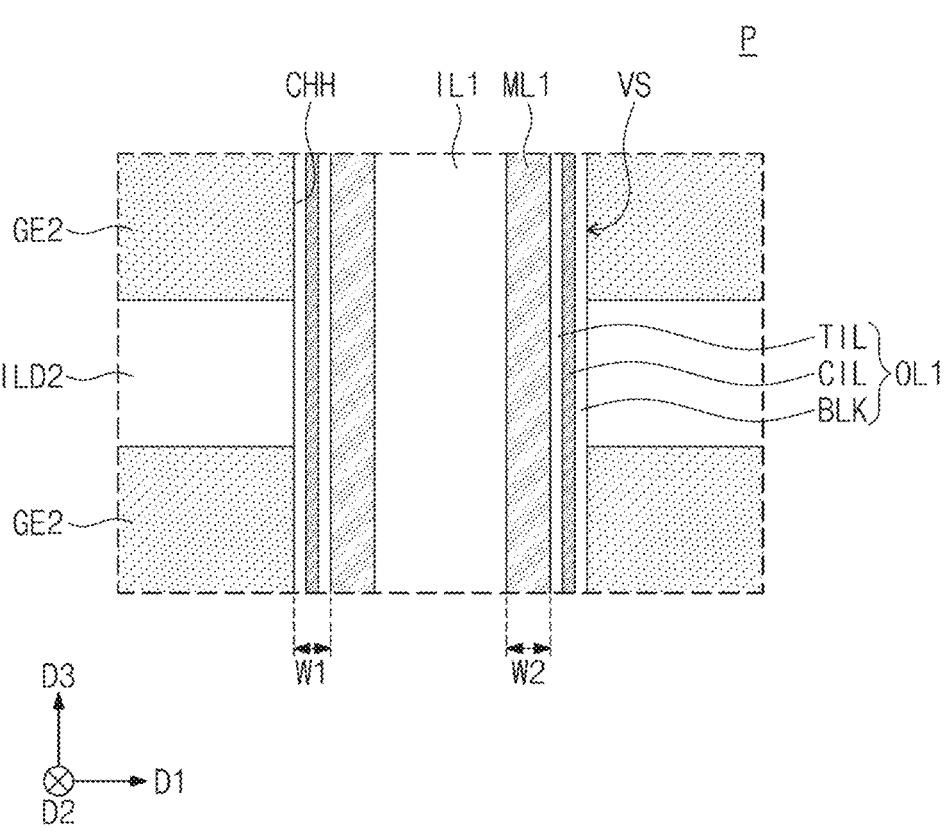
Figure 8B:
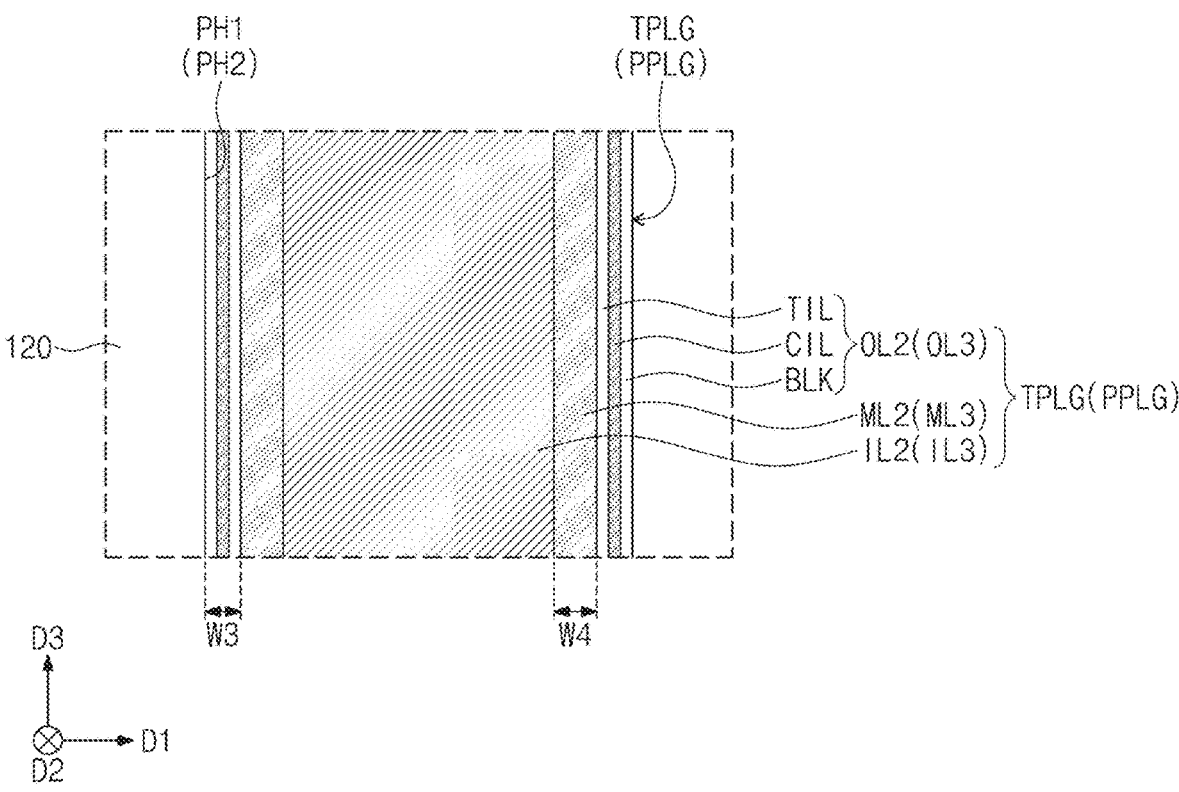
Figure 8C:
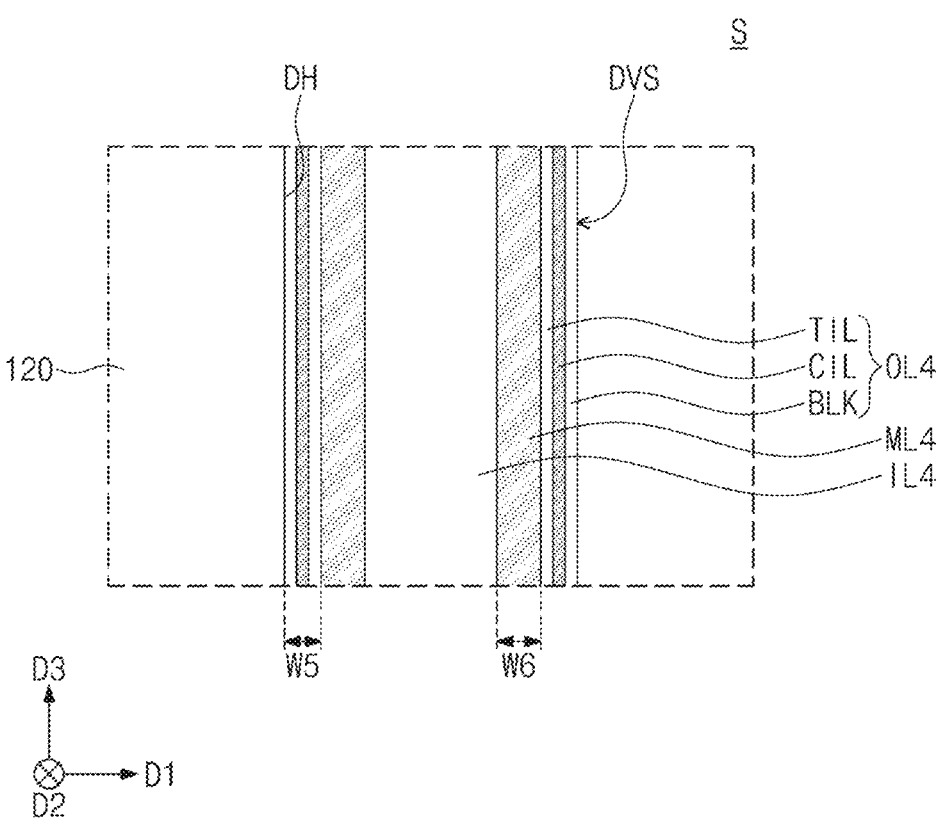
Figure 9A:
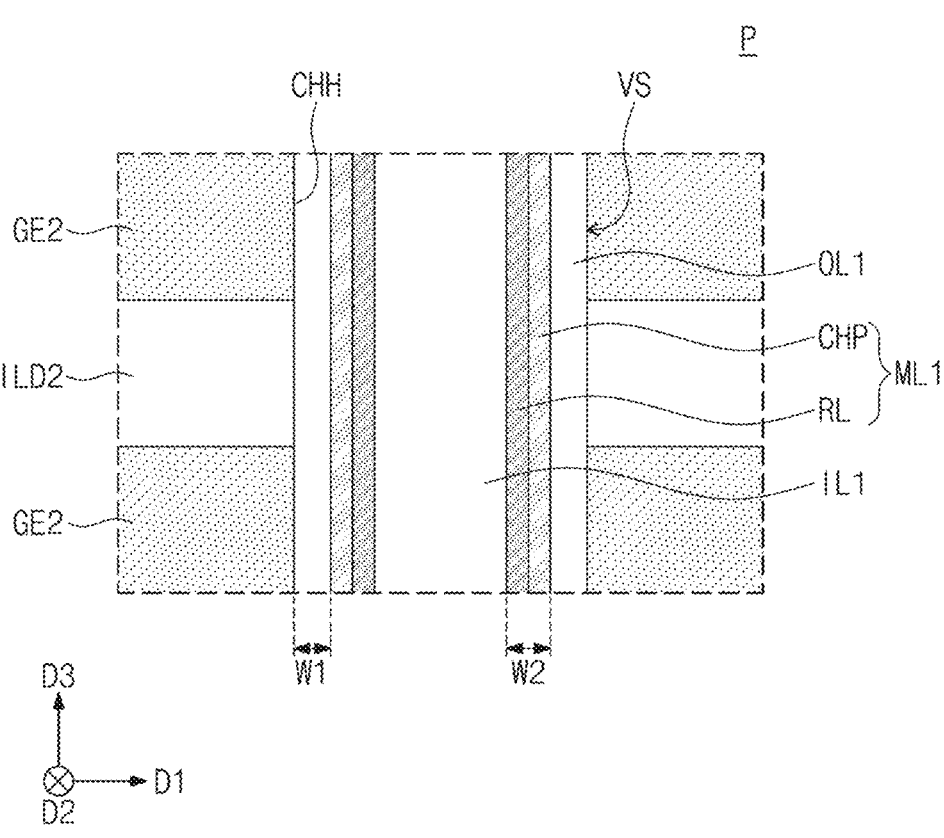
Figure 9B:
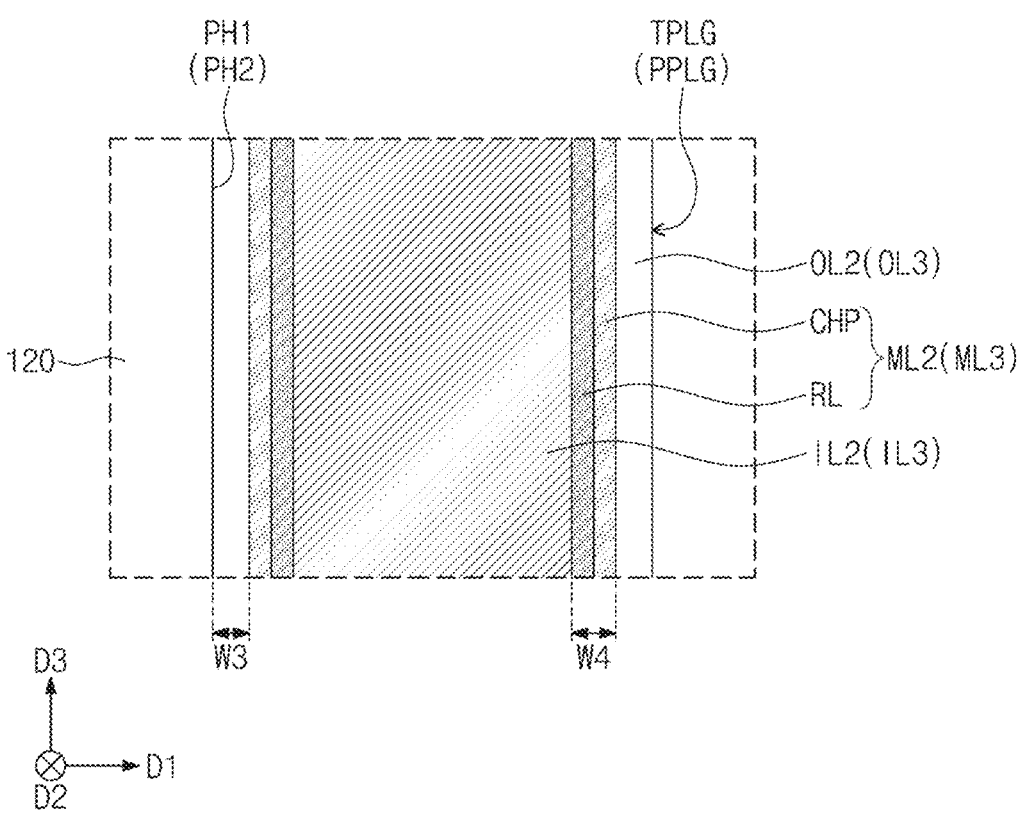
Figure 9C:
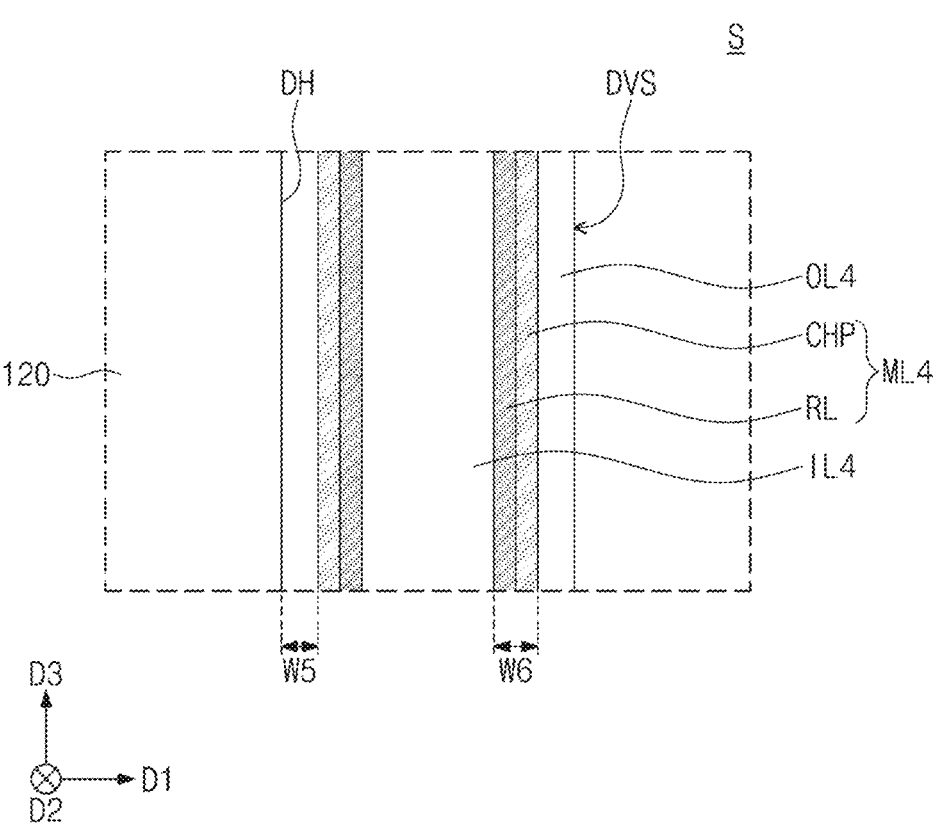

FIGS. 7A, 8A, and 9A are enlarged sectional views illustrating a portion 'P' of FIG. 6A. FIGS. 7B, 8B, and 9B are enlarged sectional views illustrating portions 'Q' and 'R' of FIG. 6A. FIGS. 7C, 8C, and 9C are enlarged sectional views illustrating a portion 'S' of FIG. 6B.

Referring to FIGS. 5, 6A, and 6B, a semiconductor device may include a semiconductor substrate 10, a peripheral circuit structure PS on the semiconductor substrate 10, and a cell array structure CS on the peripheral circuit structure PS.

The semiconductor substrate 10 may be a silicon substrate. The semiconductor substrate 10 may include a cell array region CAR and a connection region CNR. The vertical structures 3220 and 4220 and the bit lines 3240 and 4240, which are electrically connected to each other and are described with reference to FIGS. 3 and 4, may be disposed on the cell array region CAR. A stepwise structure, which includes pad portions PAD to be described below, may be disposed on the connection region CNR.

A device isolation layer 11 may be provided in the semiconductor substrate 10. The device isolation layer 11 may define an active region of the semiconductor substrate 10. The device isolation layer 11 may be formed of or include, for example, silicon oxide.

The peripheral circuit structure PS may include peripheral circuits PTR, peripheral contact plugs PCP, peripheral circuit lines PLP, and a lower insulating layer 50, which are provided on the semiconductor substrate 10.

The peripheral circuits PTR may include row and column decoders, a page buffer, a control circuit, and so forth. For example, the peripheral circuits PTR may include NMOS and PMOS transistors. The peripheral circuit lines PLP may be electrically connected to the peripheral circuits PTR through the peripheral contact plugs PCP.

The lower insulating layer 50 may be provided on the top surface of the semiconductor substrate 10. The lower insulating layer 50 may be provided on the semiconductor substrate 10 to cover the peripheral circuits PTR, the peripheral contact plugs PCP, and the peripheral circuit lines PLP.

The lower insulating layer 50 may include a plurality of stacked insulating layers. For example, the lower insulating layer 50 may include a silicon oxide layer, a silicon nitride layer, a silicon oxynitride layer, and/or a low-k dielectric layer. In an example embodiment, the lower insulating layer 50 may include a first lower insulating layer 51, a second lower insulating layer 55, and an etch stop layer 53 between the first and second lower insulating layers 51 and 55. The etch stop layer 53 may be formed of or include an insulating material different from the first and second lower insulating layers 51 and 55 and may cover the top surfaces of the uppermost ones of the peripheral circuit lines PLP.

The cell array structure CS may be disposed on the lower insulating layer 50 of the peripheral circuit structure PS. The cell array structure CS may include a semiconductor layer 100, a source structure CST, an electrode structure ST, vertical structures VS, dummy vertical structures DVS, cell contact plugs CPLG, penetration contact plugs TPLG, peripheral contact plugs PPLG, bit lines BL, and conductive lines CL.

In an example embodiment, the cell strings CSTR (e.g., of FIG. 1) may be integrated on the semiconductor layer 100. The electrode structure ST and the vertical structures VS may constitute the cell strings CSTR (e.g., of FIG. 1).

For example, the semiconductor layer 100 may be disposed on a top surface of the lower insulating layer 50. The semiconductor layer 100 may be formed of or include at least one of semiconductor materials, insulating materials, and conductive materials. The semiconductor layer 100 may be formed of or include a doped semiconductor material of a first conductivity type (e.g., n-type) and/or an undoped or intrinsic semiconductor material. The semiconductor layer 100 may be formed to have one of single-crystalline, poly-crystalline, and amorphous structures.

In the present specification, a first direction D1 may be parallel to a bottom surface of the semiconductor substrate 10. A second direction D2 may be parallel to the bottom surface of the semiconductor substrate 10 and may not be parallel to the first direction D1. A third direction D3 may be perpendicular to the bottom surface of the semiconductor substrate 10 and may not be parallel to (e.g., perpendicular to) the first and second directions D1 and D2.

The source structure CST may be disposed between semiconductor layer 100 and the electrode structure ST. The source structure CST may be parallel to a top surface of the semiconductor layer 100 and may be extended from the cell array region CAR in the first direction D1 to be parallel to the electrode structure ST.

The source structure CST may include a source conductive pattern SC and a support conductive pattern SP on the source conductive pattern SC. The source conductive pattern SC may be disposed in the cell array region CAR and between the semiconductor layer 100 and the electrode structure ST. The source conductive pattern SC may be formed of or include a semiconductor material that is doped with dopants (e.g., phosphorus (P) or arsenic (As)) to have a first conductivity type. In an example embodiment, the source conductive pattern SC may be formed of a poly-silicon layer doped with n-type dopants.

In an example embodiment, dummy insulating patterns 101p, 103p, and 105p may be disposed in the connection region CNR and between the semiconductor layer 100 and the electrode structure ST. The dummy insulating patterns 101p, 103p, and 105p may be located at substantially the same level as the source conductive pattern SC.

The dummy insulating patterns 101p, 103p, and 105p may have openings OP on the connection region CNR. The openings OP may be spaced apart from each other and may have a bar or line shape. For example, the openings OP may be a line-shaped empty space that is extended in the first direction D1, and lengths of the openings OP in the first direction D1 may vary depending on their positions.

The dummy insulating patterns 101p, 103p, and 105p may include a first insulating pattern 101p, a second insulating pattern 103p, and a third insulating pattern 105p, which are sequentially stacked. The second insulating pattern 103p may be formed of or include an insulating material different from the first and third insulating patterns 101p and 105p. The second insulating pattern 103p may be thicker than the first and third insulating patterns 101p and 105p. The first insulating pattern 101p, the second insulating pattern 103p, and the third insulating pattern 105p may be formed of or include at least one of silicon oxide, silicon nitride, silicon oxynitride, silicon carbide, and silicon germanium.

The support conductive pattern SP may cover a top surface of the source conductive pattern SC in the cell array region CAR and may cover top surfaces of the dummy insulating patterns 101p, 103p, and 105p in the connection region CNR. The support conductive pattern SP may be formed of or include a doped semiconductor material of the first conductivity type (e.g., n-type) and/or an undoped or intrinsic semiconductor material.

In the connection region CNR, portions of the support conductive pattern SP may be in contact with the semiconductor layer 100. The support conductive pattern SP may fill the openings OP of the dummy insulating patterns 101p, 103p, and 105p. The support conductive pattern SP may cover side surfaces of the dummy insulating patterns 101p, 103p, and 105p in the openings OP. The support conductive pattern SP may have a recessed top surface in the opening OP.

A penetration insulating pattern 111 may be provided in the connection region CNR to penetrate the source structure CST and the semiconductor layer 100. The penetration insulating pattern 111 may be in contact with the lower insulating layer 50 and may have a top surface that is substantially coplanar with the top surface of the source structure CST.

The electrode structure ST may be disposed on the source structure CST. The electrode structure ST may be extended from the cell array region CAR to the connection region CNR in the first direction D1 and may have a stepwise structure on the connection region CNR.

The electrode structure ST may include electrodes GE1 and GE2 and insulating layers ILD1 and ILD2, which are alternately stacked in the third direction D3. The electrodes GE1 and GE2 may be formed of or include doped semiconductor materials (e.g., doped silicon). Each of the insulating layers ILD1 and ILD2 may include a silicon oxide layer and/or a low-k dielectric layer. In an example embodiment, the semiconductor device may be a vertical NAND FLASH memory device, and in this case, the electrodes GE1 and GE2 of the electrode structure ST may be used as the gate lower lines LL1 and LL2, the word lines WL, and the gate upper lines UL1 and UL2 described with reference to FIG. 1.

In an example embodiment, the electrode structure ST may include a first electrode structure ST1 and a second electrode structure ST2 on the first electrode structure ST1. The first electrode structure ST1 may include first electrodes GE1 and first insulating layers ILD1, which are alternately stacked on the semiconductor layer 100 in the third direction D3. The second electrode structure ST2 may include second electrodes GE2 and second insulating layers ILD2, which are alternately stacked on the first electrode structure ST1 in the third direction D3. The lowermost one of the second insulating layers ILD2 may be disposed on the uppermost one of the first insulating layers ILD1.

Each of the electrodes GE1 and GE2 of the electrode structure ST may have the pad portion PAD on the connection region CNR. The pad portions PAD of the electrodes GE1 and GE2 may be disposed in the first direction D1, and the cell contact plugs CPLG may be coupled to the pad portions PAD of the electrodes GE1 and GE2, respectively.

The pad portions PAD of the electrodes GE1 and GE2 may be located at positions that are different from each other in horizontal and vertical directions.

A planarization insulating layer 120 may be provided to cover the pad portions PAD of the electrode structure ST having the stepwise structure. The planarization insulating layer 120 may have a substantially flat top surface. The planarization insulating layer 120 may include a single insulating layer or a plurality of stacked insulating layers. First to fourth interlayer insulating layers 130, 140, 150, and 160 may be sequentially stacked on the planarization insulating layer 120.

A first separation structure SS1, a second separation structure SS2, and a third separation structure SS3 may be provided on the semiconductor layer 100 to penetrate the electrode structure ST. Each of the first, second, and third separation structures SS1, SS2, and SS3 may include an insulating layer covering a side surface of the electrode structure ST. Each of the first, second, and third separation structures SS1, SS2, and SS3 may have a single- or multi-layered structure. A top surface of the first separation structure SS1, a top surface of the second separation structure SS2, and a top surface of the third separation structure SS3 may be located at substantially the same level.

The first separation structures SS1 may be extended from the cell array region CAR to the connection region CNR in the first direction D1 and may be spaced apart from each other the second direction D2 crossing the first direction D1. The first separation structures SS1 may be provided to penetrate the support conductive pattern SP in the cell array region CAR. The first separation structures SS1 may be inserted into the source conductive pattern SC. The first separation structures SS1 may include a lower portion, which is inserted in the source conductive pattern SC, and an upper portion, which is provided to penetrate the electrode structure ST, and a width of the lower portion may be smaller than a width of the upper portion.

In the cell array region CAR, the second separation structures SS2 may be provided to penetrate the electrode structure ST. The second separation structure SS2 may be disposed between the first separation structures SS1. The second separation structure SS2 may be extended to a region on the connection region CNR, but a length of the second separation structure SS2 in the first direction D1 may be smaller than a length of the first separation structure SS1 in the first direction D1. In some example embodiments, a plurality of second separation structures SS2 may be provided between the first separation structures SS1.

The third separation structures SS3 may be spaced apart from the first and second separation structures SS1 and SS2 in the connection region CNR and may be provided to penetrate the planarization insulating layer 120 and the electrode structure ST. The third separation structures SS3 may be extended in the first direction D1. The third separation structures SS3 may be spaced apart from each other in the first and second directions D1 and D2.

The vertical structures VS may be provided in the cell array region CAR to penetrate the electrode structure ST and a source structure SCT. When viewed in a plan view, the vertical structures VS may be arranged in a linear or zigzag shape.

The vertical structures VS may be provided in vertical channel holes CHH penetrating the electrode structure ST. The vertical structures VS may include a first outer layer OL1 and a first intermediate layer ML1, which are sequentially provided on an inner side surface of each of the vertical channel holes CHH, a first inner layer IL1, which is provided to fill an internal space enclosed by the first intermediate layer ML1, and a conductive pad CPAD, which is provided on the first inner layer IL1. In other words, each of the vertical structures VS may include the first inner layer IL1, the first outer layer OL1 enclosing the first inner layer IL1, and the first intermediate layer ML1 interposed between the first inner layer IL1 and the first outer layer OL1. The first intermediate layer ML1 of each of the vertical structures VS may be in contact with a portion of the source conductive pattern SC. A top surface of each of the vertical structures VS may have a circular, elliptical, or bar shape. In an example embodiment, the conductive pad CPAD may be formed of or include at least one of doped semiconductor materials and conductive materials.

Each of the vertical structures VS may include a first vertically-extended portion penetrating the first electrode structure ST1, a second vertically-extended portion penetrating the second electrode structure ST2, and an extension portion between the first and second vertically-extended portions. The extension portion may be provided in the uppermost one of the first insulating layers ILD1. Although not shown, a diameter of the vertical structure VS may be abruptly increased at the extension portion. In addition, as a distance from a bottom surface of the semiconductor layer 100 increases in the third direction D3, the first and second vertically-extended portions of the vertical structure VS may have increasing diameters, but the inventive concepts are not limited to this example.

The first interlayer insulating layer 130 may be disposed on the planarization insulating layer 120 to cover top surfaces of the vertical structures VS and top surfaces of the dummy vertical structures DVS. The second interlayer insulating layer 140 may be disposed on the first interlayer insulating layer 130. The second interlayer insulating layer 140 may cover the top surface of the first separation structure SS1, the top surface of the second separation structure SS2, and the top surface of the third separation structure SS3.

In the connection region CNR, the penetration contact plugs TPLG may be provided to penetrate the planarization insulating layer 120, the electrode structure ST, and the penetration insulating pattern 111 and may be connected to the peripheral circuit line PLP. When viewed in a plan view, the penetration contact plug TPLG may be provided in the penetration insulating pattern 111. The penetration contact plugs TPLG may be provided in first penetration holes PH1, which are formed to penetrate the planarization insulating layer 120, the electrode structure ST, and the penetration insulating pattern 111. The penetration contact plugs TPLG may include a second outer layer OL2, a second intermediate layer ML2, and a second inner layer IL2, which are sequentially provided on an inner side surface of each of the first penetration holes PH1. In other words, each of the penetration contact plugs TPLG may include the second inner layer IL2, the second outer layer OL2 enclosing the second inner layer IL2, and the second intermediate layer ML2 interposed between the second inner layer IL2 and the second outer layer OL2.

The penetration contact plugs TPLG may be connected to the conductive lines CL through contact plugs LCT. The penetration contact plugs TPLG may be electrically connected to the cell contact plugs CPLG through the conductive lines CL.

In the connection region CNR, the peripheral contact plugs PPLG may be provided to penetrate the planarization insulating layer 120 and may be coupled to the semiconductor layer 100. In some example embodiments, the peripheral contact plugs PPLG may be provided to penetrate the planarization insulating layer 120 and may be coupled to the support conductive pattern SP. The peripheral contact plugs PPLG may be provided in second penetration holes PH2, which are formed to penetrate the planarization insulating layer 120. The peripheral contact plugs PPLG may include a third outer layer OL3, a third intermediate layer ML3, and a third inner layer IL3, which are sequentially provided on an inner side surface of each of the second penetration holes PH2. In other words, each of the peripheral contact plugs PPLG may include the third inner layer IL3, the third outer layer OL3 enclosing the third inner layer IL3, and the third intermediate layer ML3 interposed between the third inner layer IL3 and the third outer layer OL3.

The peripheral contact plugs PPLG may be horizontally spaced apart from the electrode structure ST. The peripheral contact plugs PPLG may be connected to the conductive lines CL through the contact plugs LCT.

The third interlayer insulating layer 150 may be provided on the second interlayer insulating layer 140 to cover the second interlayer insulating layer 140.

In the connection region CNR, the dummy vertical structures DVS may be provided to penetrate the planarization insulating layer 120, the electrode structure ST, the support conductive pattern SP, and the dummy insulating patterns 101*p*, 103*p*, and 105*p*. The dummy vertical structures DVS may be provided in dummy holes DH, which are formed to penetrate the planarization insulating layer 120, the electrode structure ST, the support conductive pattern SP, and the dummy insulating patterns 101*p*, 103*p*, and 105*p*. The dummy vertical structures DVS may include a fourth outer layer OL4 and a fourth intermediate layer ML4, which are sequentially provided on an inner side surface of each of the dummy holes DH, a fourth inner layer IL4, which is provided to fill an internal space enclosed by the fourth intermediate layer ML4, and a conductive pad CPAD, which is provided on the fourth inner layer IL4. In other words, the dummy vertical structures DVS may include the fourth inner layer IL4, the fourth outer layer OL4 enclosing the fourth inner layer IL4, and the fourth intermediate layer ML4 interposed between the fourth inner layer IL4 and the fourth outer layer OL4. In an example embodiment, the dummy vertical structures DVS may not include the conductive pad CPAD. The fourth intermediate layer ML4 of the dummy vertical structures DVS may be spaced apart from the source conductive pattern SC and may not be in contact with the source conductive pattern SC.

The dummy vertical structures DVS may be inserted into the semiconductor layer 100. The dummy vertical structures DVS may be provided to penetrate the pad portion PAD of each of the electrodes GE1 and GE2. The dummy vertical structures DVS may have top surfaces that are substantially coplanar with the top surfaces of the vertical structures VS. When viewed in a plan view, the top surfaces of the dummy vertical structures DVS may have various shapes (e.g., circular, elliptical, and bar shapes).

The dummy vertical structures DVS may be disposed around each cell contact plug CPLG. In the case where the top surfaces of the dummy vertical structures DVS have the elliptical shape, the long axes of the dummy vertical structures DVS in each pad portion PAD may be oriented in different directions. In an example embodiment, a plurality of dummy vertical structures DVS may be provided between adjacent ones of the cell contact plugs CPLG. In other words, each of the dummy vertical structures DVS may be surrounded by a group of adjacent cell contact plugs CPLG.

The cell contact plugs CPLG may be provided to penetrate the first interlayer insulating layer 130, the second interlayer insulating layer 140, the third interlayer insulating layer 150, and the planarization insulating layer 120 and may be coupled to the pad portions PAD of the electrodes GE1 and GE2, respectively. The smaller the distance to the cell array region CAR, the smaller the vertical lengths of the cell contact plugs CPLG. The cell contact plugs CPLG may have top surfaces that are substantially coplanar with each other. In the connection region CNR, the conductive lines CL may be disposed on the fourth interlayer insulating layer 160 and may be coupled to the cell contact plugs CPLG through the contact plugs LCT. In an example embodiment, the cell contact plugs CPLG may be formed of or include at least one of metallic materials (e.g., tungsten, copper, and aluminum), conductive metal nitride materials (e.g., titanium nitride and tantalum nitride), and transition metals (e.g., titanium and tantalum).

Although the bit lines are not illustrated in the plan views, but as shown in FIGS. 6A and 6B, the bit lines BL may be disposed on the cell array region CAR and on the fourth interlayer insulating layer 160 to cross the electrode structure ST and extend in the second direction D2. The bit lines BL may be electrically connected to the vertical structures VS through lower and upper bit line contact plugs BCTa and BCTb.

Referring to FIGS. 6A, 6B, and 7A, the first outer layer OL1 of the vertical structure VS may be provided adjacent to the electrode structure ST and may cover side surfaces of the insulating layers ILD1 and ILD2 and side surfaces of the electrodes GE1 and GE2. The first intermediate layer ML1 may conformally cover an inner side surface of the first outer layer OL1. The first intermediate layer ML1 may have a pipe or macaroni shape with closed bottom. The first inner layer IL1 may be provided in a space enclosed by the first intermediate layer ML1 and the conductive pad CPAD.

In an example embodiment, the first outer layer OL1 may be formed of or include ferroelectric materials. The ferroelectric materials may include at least one of, for example, hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate. In an example embodiment, the polarization of the ferroelectric material may be switched to change a threshold voltage of the first intermediate layer ML1, and by using this change, it may be possible to store and/or change data in the first outer layer OL1 of the vertical structure VS.

The first outer layer OL1 may have a first width W1. The first width W1 may be a width between outer and inner side surfaces of the first outer layer OL1.

In an example embodiment, the first intermediate layer ML1 may be formed of or include at least one of doped semiconductor materials, undoped or intrinsic semiconductor materials, and a poly-crystalline or single-crystalline structure. The first intermediate layer ML1 may have a second width W2. The second width W2 may be a width between outer and inner side surfaces of the first intermediate layer ML1.

In an example embodiment, the first inner layer IL1 may be formed of or include an insulating material (e.g., silicon oxide).

Referring to FIGS. 6A, 6B, and 7B, the second outer layer OL2 of the penetration contact plug TPLG may be provided adjacent to (e.g., provided to penetrate) the planarization insulating layer 120, the electrode structure ST, the penetration insulating pattern 111, and the second lower insulating layer 55 and may cover a side surface of the planarization insulating layer 120, side surfaces of the insulating layers ILD1 and ILD2, side surfaces of the electrodes GE1 and GE2, a side surface of the penetration insulating pattern 111, and a side surface of the second lower insulating layer 55. The second outer layer OL2 may be in contact with the electrodes GE1 and GE2. The second intermediate layer ML2 may conformally cover an inner side surface of the second outer layer OL2. The second outer layer OL2 and the second intermediate layer ML2 may have a pipe or macaroni shape with opened bottom. The second inner layer IL2 may be provided in an empty space, which is enclosed by the second intermediate layer ML2, and may be further extended in the third direction D3 to have a length larger than the second outer layer OL2 and the second intermediate layer ML2. The second inner layer IL2 may further penetrate the first interlayer insulating layer 130 and the second interlayer insulating layer 140. A top surface of the second inner layer IL2 may be located at a level that is higher than a top surface of the second outer layer OL2 and a top surface of the second intermediate layer ML2. A height of the second inner layer IL2 may be higher than a height of the second outer layer OL2 and a height of the second intermediate layer ML2. In other words, the second inner layer IL2 may be extended to a level higher than the second outer layer OL2 and the second intermediate layer ML2. The second inner layer IL2 may be further extended into the opened bottoms of the second outer layer OL2 and the second intermediate layer ML2 and may be connected to the peripheral circuit lines PLP of the peripheral circuit structure PS.

The second inner layer IL2 may be spaced apart from the electrodes GEL and GE2 of the electrode structure ST by the second outer layer OL2 and the second intermediate layer ML2. The second inner layer IL2 may be electrically disconnected from the electrodes GE1 and GE2 of the electrode structure ST by the second outer layer OL2 and the second intermediate layer ML2.

The second outer layer OL2 may be formed of or include the same material as the first outer layer OL1. The second outer layer OL2 may have a third width W3. The third width W3 may be a width between outer and inner side surfaces of the second outer layer OL2. The third width W3 may be substantially equal to the first width W1.

In this specification, the expression "substantially the same as" or "substantially equal to" may be used to describe situations where two entities have no difference in a mathematical sense or have a small difference within a desired (or alternatively, predetermined) process tolerance.

The second intermediate layer ML2 may be formed of or include the same material as the first intermediate layer ML1. The second intermediate layer ML2 may have a fourth width W4. The fourth width W4 may be a width between outer and inner side surfaces of the second intermediate layer ML2. The fourth width W4 may be substantially equal to the second width W2.

The second inner layer IL2 may be formed of or include a material different from the first inner layer IL1. The second inner layer IL2 may be formed of or include metallic materials (e.g., titanium, tantalum, ruthenium, cobalt, manganese, tungsten, nickel, or copper). A barrier pattern may be further provided between the second inner layer IL2 and the second intermediate layer ML2. In an example embodiment, the barrier pattern may include at least one of a titanium layer, a titanium nitride layer, a tantalum layer, a tantalum nitride layer, a ruthenium layer, a cobalt layer, a manganese layer, a tungsten nitride layer, a nickel layer, a nickel boride layer, a double layer including a titanium layer and a titanium nitride layer, and a composite layer different from the double layer.

The third outer layer OL3 of the peripheral contact plug PPLG may be provided adjacent to (e.g., provided to penetrate) the planarization insulating layer 120 and the semiconductor layer 100 and may cover a side surface of the planarization insulating layer 120. The third intermediate layer ML3 may conformally cover an inner side surface of the third outer layer OL3. The third outer layer OL3 and the third intermediate layer ML3 may have a pipe or macaroni shape with opened bottom. The third inner layer IL3 may be provided in an empty space, which is enclosed by the third intermediate layer ML3, and may be further extended in the third direction D3 to have a length larger than the third outer layer OL3 and the third intermediate layer ML3. A top surface of the third inner layer IL3 may be higher than a top surface of the third outer layer OL3 and a top surface of the third intermediate layer ML3. The third inner layer IL3 may be further extended into the opened bottoms of the third outer layer OL3 and the third intermediate layer ML3 and may be connected to the semiconductor layer 100.

The third inner layer IL3 may be spaced apart from the electrodes GE and GE2 of the electrode structure ST by the third outer layer OL3 and the third intermediate layer ML3. The third inner layer IL3 may be electrically disconnected from the electrodes GE1 and GE2 of the electrode structure ST by the third outer layer OL3 and the third intermediate layer ML3.

The third outer layer OL3 may be formed of or include the same material as the first and second outer layers OL1 and OL2. The third outer layer OL3 may have the third width W3.

The third intermediate layer ML3 may be formed of or include the same material as the first and second intermediate layers ML1 and ML2. The third intermediate layer ML3 may have the fourth width W4.

The third inner layer IL3 may be formed of or include a material different from the first inner layer IL1. The third inner layer IL3 may be formed of or include the same material as the second inner layer IL2.

A width of the first inner layer IL1 in the first direction D1 may be different from a width of the second inner layer IL2 in the first direction D1. The width in the first direction D1 of the first inner layer IL1 may be different from a width of the third inner layer IL3 in the first direction D1.

Referring to FIGS. 6A, 6B, and 7C, the fourth outer layer OL4 of the dummy vertical structure DVS may be provided adjacent to (e.g., provided to penetrate) the electrode structure ST and may cover side surfaces of the insulating layers ILD1 and ILD2 and side surfaces of the electrodes GE1 and GE2. The fourth intermediate layer ML4 may conformally cover an inner side surface of the fourth outer layer OL4. The fourth outer layer OL4 and the fourth intermediate layer ML4 may have a pipe or macaroni shape with closed bottom. The fourth inner layer IL4 may be provided in a space enclosed by the fourth intermediate layer ML4 and the conductive pad CPAD.

The fourth outer layer OL4 may be formed of or include the same material as the first, second, and third outer layers OL1, OL2, and OL3. The fourth outer layer OL4 may have a fifth width W5. The fifth width W5 may be a width between outer and inner side surfaces of the fourth outer layer OL4. The fifth width W5 may be substantially equal to the first and third widths W1 and W3.

The fourth intermediate layer ML4 may be formed of or include the same material as the first, second, and third intermediate layers ML1, ML2, and ML3. The fourth intermediate layer ML4 may have a sixth width W6. The sixth width W6 may be a width between outer and inner side surfaces of the fourth intermediate layer ML4. The sixth width W6 may be substantially equal to the second and fourth widths W2 and W4.

The fourth inner layer IL4 may be formed of or include the same material as the first inner layer IL1. The fourth inner layer IL4 may be formed of or include a material different from the second and third inner layers IL2 and IL3.

In the following description, an element previously described with reference to FIGS. 7A, 7B, and 7C may be identified by the same reference number without repeating an overlapping description thereof, for concise description.

Referring to FIG. 8A, the first outer layer OL1 may be composed of a plurality of thin films. The first outer layer OL1 may be formed of or include a material different from the first outer layer OL1 of FIG. 7A. The first outer layer OL1 may be used as a data storing layer of a NAND FLASH memory device and may include a blocking insulating layer BLK, a charge storing layer CIL, and a tunneling insulating layer TIL, which are sequentially stacked on an inner side surface of each of the vertical channel holes CHH. The blocking insulating layer BLK may be adjacent to the electrode structure ST, and the tunneling insulating layer TIL may be adjacent to the first intermediate layer ML1. The charge storing layer CIL may be interposed between the blocking insulating layer BLK and the tunneling insulating layer TIL.

In an example embodiment, the Fowler-Nordheim (FN) tunneling phenomenon, which is caused by a voltage difference between the first intermediate layer ML1 and the first and second electrodes GE1 and GE2, may be used to store or change data in the first outer layer OL1. For example, the blocking insulating layer BLK and the tunneling insulating layer TIL may be formed of or include silicon oxide, and the charge storing layer CIL may be formed of or include silicon nitride or silicon oxynitride.

Referring to FIG. 8B, each of the second and third outer layers OL2 and OL3 may be composed of a plurality of thin films. Each of the second and third outer layers OL2 and OL3 may include the same elements as those in the first outer layer OL1 of FIG. 8A. That is, each of the second and third outer layers OL2 and OL3 may include the blocking insulating layer BLK, the charge storing layer CIL, and the tunneling insulating layer TIL, which are sequentially stacked on an inner side surface of each of the first or second penetration holes PH1 or PH2.

Referring to FIG. 8C, the fourth outer layer OL4 may be composed of a plurality of thin films. The fourth outer layer OL4 may include the same elements as those in the first outer layer OL1. In other words, the fourth outer layer OL4 may include the blocking insulating layer BLK, the charge storing layer CIL, and the tunneling insulating layer TIL, which are sequentially stacked on an inner side surface of each of the dummy holes DH.

In the following description, an element previously described with reference to FIGS. 7A, 7B, and 7C may be identified by the same reference number without repeating an overlapping description thereof, for concise description.

Referring to FIG. 9A, the first outer layer OL1 may be formed of or include a material different from the first outer layer OL1 of FIG. 7A. The first outer layer OL1 may be formed of or include an insulating material (e.g., silicon oxide).

The first intermediate layer ML1 may be composed of a plurality of thin films. The first intermediate layer ML1 may include a channel layer CHP and a variable resistance layer RL, which are sequentially stacked on an inner side surface of the first outer layer OL1. The channel layer CHP may be formed of or include at least one of a doped semiconductor material, an undoped or intrinsic semiconductor material, and a polycrystalline semiconductor material. The variable resistance layer RL may be formed of or include transition metal oxide (TMO) materials. For example, the variable resistance layer RL may be formed of or include at least one of Ni oxide, Cu oxide, Ti oxide, Co oxide, Hf oxide, Zr oxide, Zn oxide, W oxide, Nb oxide, TiNi oxide, LiNi oxide, Al oxide, InZn oxide, V oxide, SrZr oxide, SrTi oxide, manganite oxide, Cr oxide, Fe oxide, and Ta oxide. An electric resistance of the variable resistance layer RL may be changed depending on a voltage applied to the first intermediate layer ML1. The first intermediate layer ML1 may change data, which is stored in the variable resistance layer RL, using such a change of the electric resistance.

The first inner layer IL1 may be formed of or include an insulating material (e.g., silicon nitride).

Referring to FIG. 9B, the second and third outer layers OL2 and OL3 may be formed of or include a material different from the first outer layer OL1 of FIG. 7A. The second and third outer layers OL2 and OL3 may be formed of or include the same material as the first outer layer OL1 of FIG. 9A.

Each of the second and third intermediate layers ML2 and ML3 may be composed of a plurality of thin films. Each of the second and third intermediate layers ML2 and ML3 may include the same elements as those in the first intermediate layer ML1 of FIG. 9A. That is, each of the second and third intermediate layers ML2 and ML3 may include the channel layer CHP and the variable resistance layer RL, which are sequentially stacked on the inner side surfaces of the second and third outer layers OL2 and OL3.

Referring to FIG. 9C, the fourth outer layer OL4 may be formed of or include a material different from the first outer layer OL1 of FIG. 7A. The fourth outer layer OL4 may be formed of or include the same material as the first outer layer OL1 of FIG. 9A.

The fourth intermediate layer ML4 may be composed of a plurality of thin films. The fourth intermediate layer ML4 may include the same elements as those in the first intermediate layer ML1 of FIG. 9A. In other words, the fourth intermediate layer ML4 may include the channel layer CHP and the variable resistance layer RL, which are sequentially stacked on the inner side surface of the fourth outer layer OL4.

FIGS. 10A to 19A are sectional views, which are taken along the line A-A' of FIG. 5 to illustrate a method of fabricating a semiconductor device according to an example embodiment of the inventive concepts. FIGS. 10B to 19B are sectional views, which are taken along the lines B-B' and C-C' of FIG. 5 to illustrate a method of fabricating a semiconductor device according to an example embodiment of the inventive concepts.

Figure 10A:
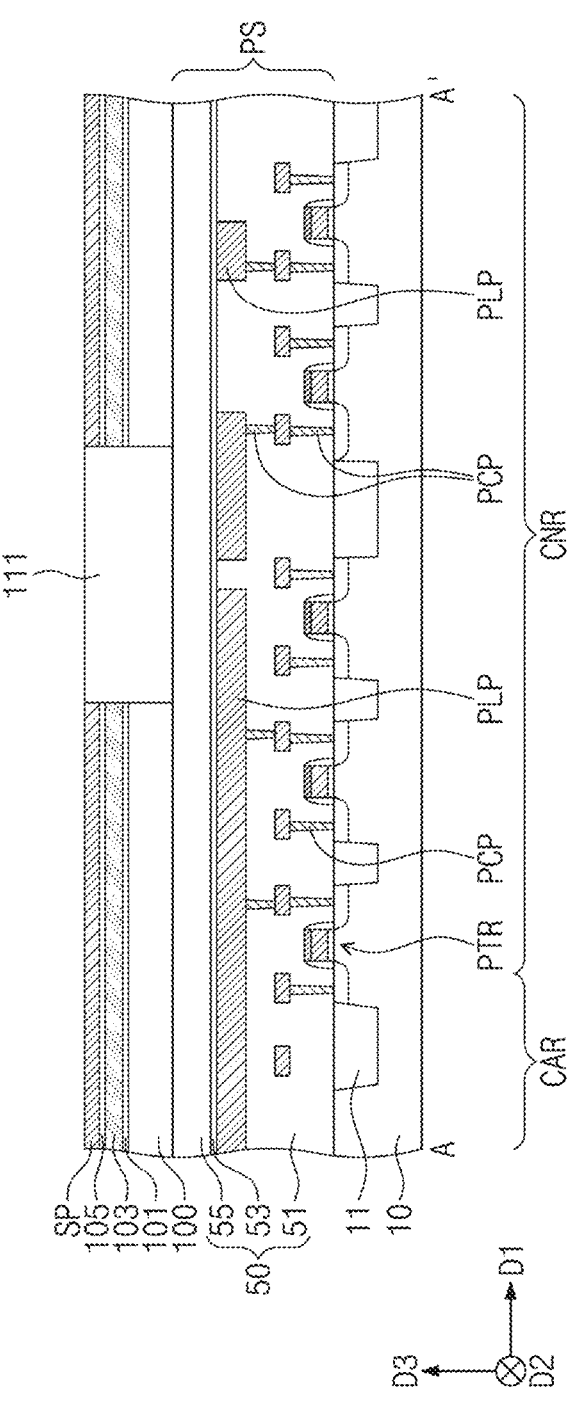
Figure 10B:
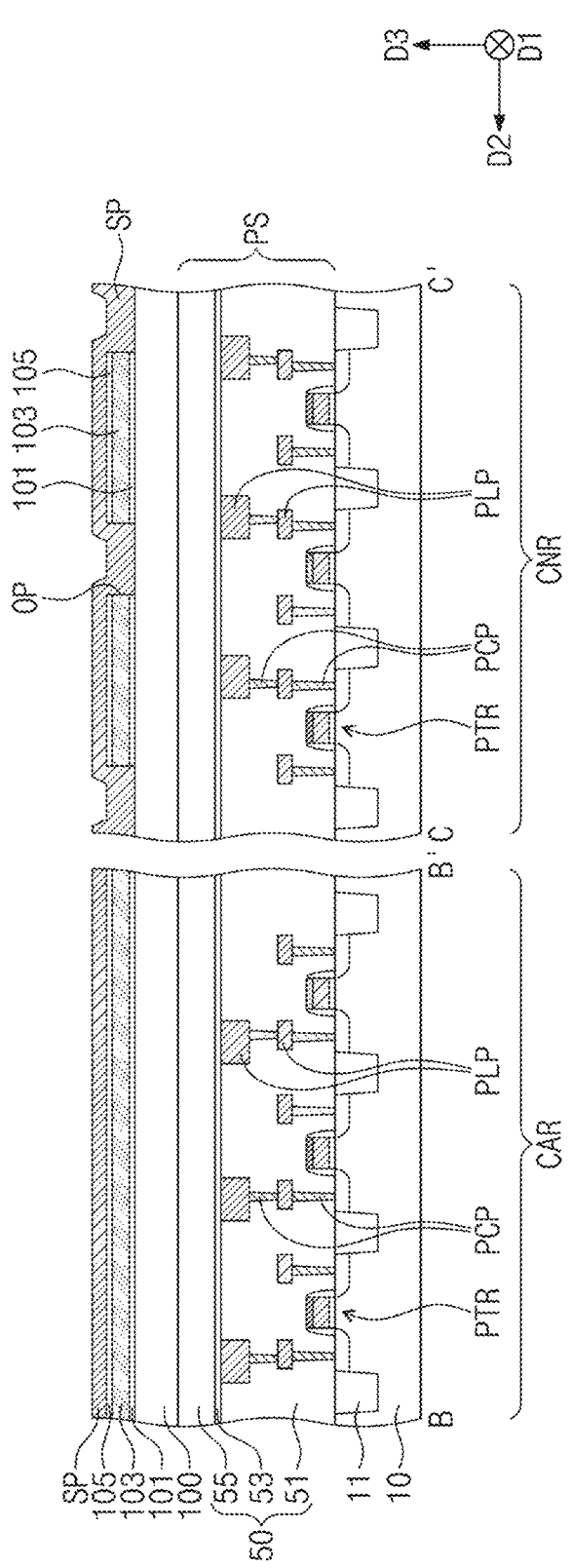
Figure 10B:

Referring to FIGS. 10A and 10B, the peripheral circuit structure PS may be formed on the semiconductor substrate 10.

The formation of the peripheral circuit structure PS may include forming the peripheral circuits PTR on the semiconductor substrate 10, forming the peripheral contact plugs PCP and the peripheral circuit lines PLP connected to the peripheral circuits PTR, and forming the lower insulating layer 50.

Row and column decoders, page buffers, and control circuits, which are used as the peripheral circuits PTR, may be formed on the semiconductor substrate 10. Here, the peripheral circuits PTR may include MOS transistors, and in this case, the semiconductor substrate 10 may be used as channel regions of the MOS transistors.

The lower insulating layer 50 may include one or more insulating layers covering the peripheral circuits PTR. The lower insulating layer 50 may include the first lower insulating layer 51, the second lower insulating layer 55, and the etch stop layer 53 between the first and second lower insulating layers 51 and 55. The lower insulating layer 50 may include, for example, a silicon oxide layer, a silicon nitride layer, a silicon oxynitride layer, and/or a low-k dielectric layer.

Thereafter, the semiconductor layer 100 may be formed on the lower insulating layer 50. The semiconductor layer 100 may be formed by depositing a semiconductor material. The semiconductor layer 100 may be formed of or include at least one of silicon (Si), germanium (Ge), silicon germanium (SiGe), gallium arsenic (GaAs), indium gallium arsenic (InGaAs), and aluminum gallium arsenic (AlGaAs). The semiconductor layer 100 may be formed of or include a doped semiconductor material and/or an undoped or intrinsic semiconductor material. The semiconductor layer 100 may be formed to have one of single-crystalline, poly-crystalline, and amorphous structures.

A first dummy insulating layer 101, a second dummy insulating layer 103, and a third dummy insulating layer 105 may be sequentially formed on the semiconductor layer 100. The first dummy insulating layer 101 may be formed by thermally oxidizing a surface of the semiconductor layer 100 or by depositing a silicon oxide layer. The second dummy insulating layer 103 may be formed of or include a material having an etch selectivity with respect to the first dummy insulating layer 101 and the third dummy insulating layer 105. In an example embodiment, the second dummy insulating layer 103 may be at least one of a silicon nitride layer, a silicon oxynitride layer, a silicon carbide layer, and a silicon germanium layer. The third dummy insulating layer 105 may be formed by depositing a silicon oxide layer.

The first dummy insulating layer 101, the second dummy insulating layer 103, and the third dummy insulating layer 105 may have the openings OP, which are formed to expose portions of the semiconductor layer 100, in the connection region CNR.

The formation of the openings OP may include forming a mask pattern (not shown) to expose portions of the connection region CNR and the cell array region CAR and etching the first, second, and third dummy insulating layers 101, 103, and 105 using the mask pattern as an etch mask to expose the semiconductor layer 100. After the formation of the openings OP, the mask pattern may be removed.

After the formation of the openings OP, the support conductive pattern SP may be deposited on the third dummy insulating layer 105 to have a uniform thickness. The support conductive pattern SP may fill the openings OP of the first dummy insulating layer 101, the second dummy insulating layer 103, and the third dummy insulating layer 105 in the cell array region CAR. In the openings OP, the support conductive pattern SP may be in direct contact with the semiconductor layer 100. The support conductive pattern SP may be a poly-silicon layer that is doped with n-type dopants and/or carbon (C).

Thereafter, the support conductive pattern SP, the third dummy insulating layer 105, the second dummy insulating layer 103, the first dummy insulating layer 101, and the semiconductor layer 100 may be patterned to form a hole (not shown) exposing a portion of the lower insulating layer 50 on the connection region CNR. Thereafter, the penetration insulating pattern 111 may be formed to fill the hole. The penetration insulating pattern 111 may be formed by filling the hole with an insulating material and performing a planarization process to expose a top surface of the support conductive pattern SP.

Figure 11A:
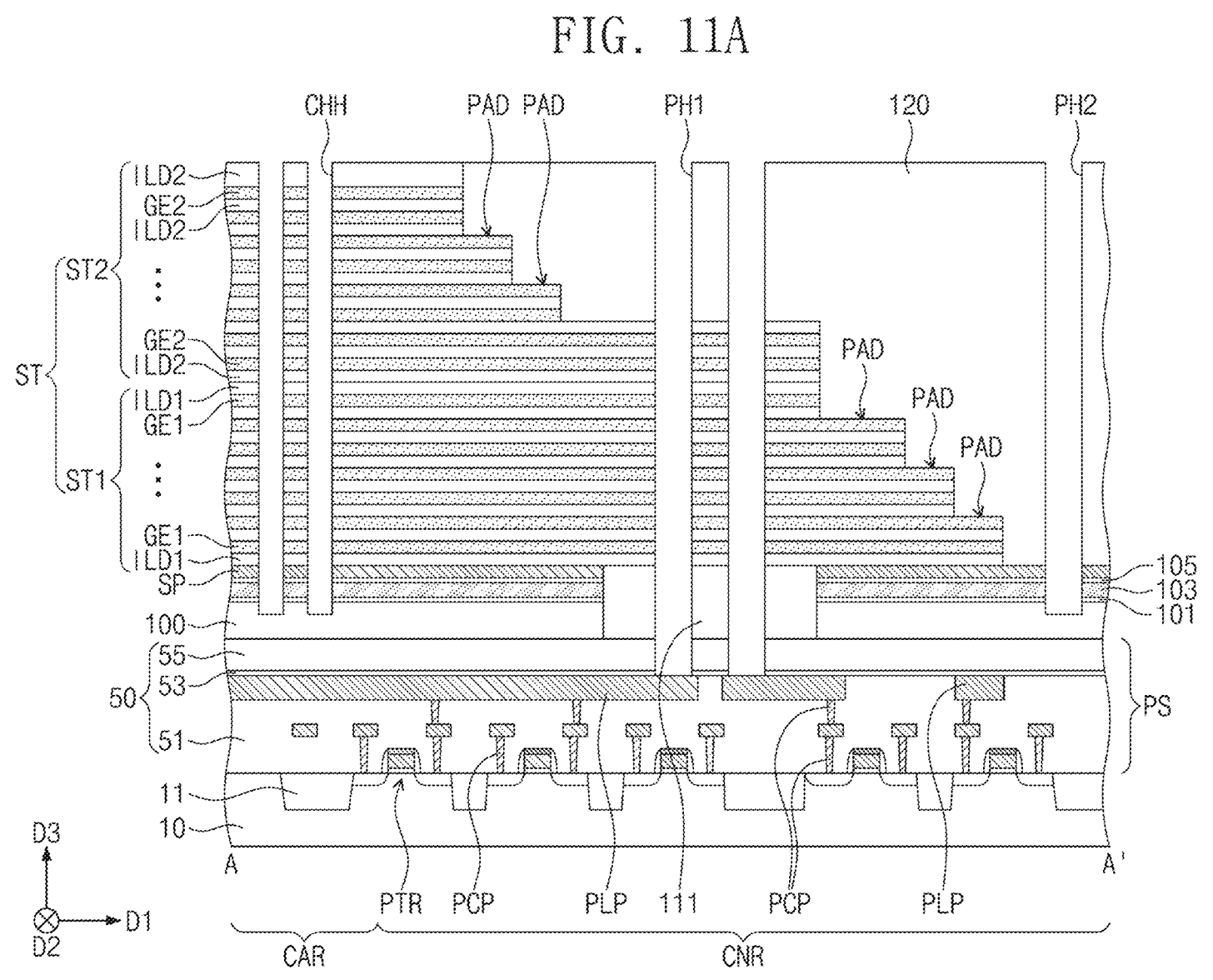
Figure 11B:
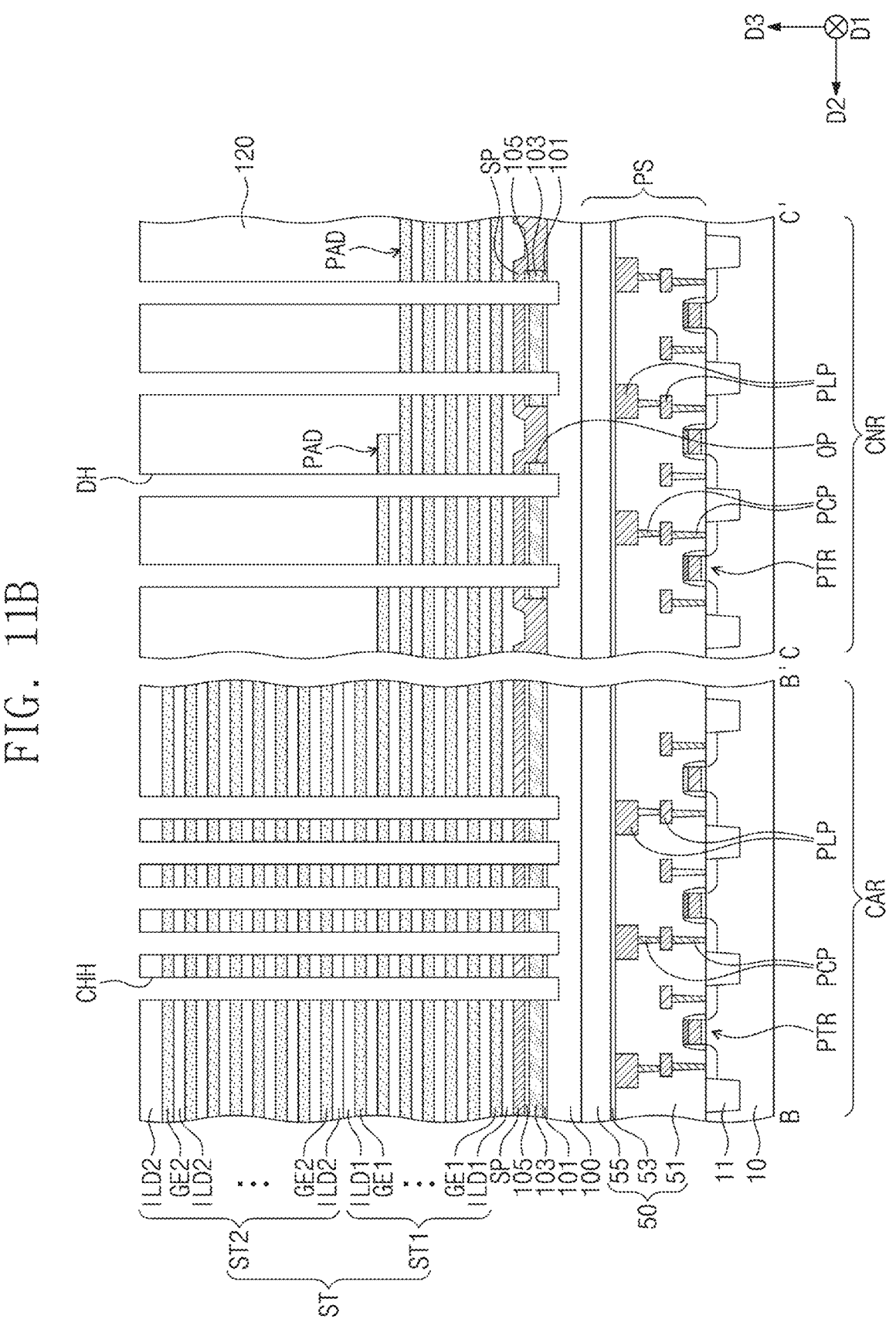

Referring to FIGS. 11A and 11B, the electrode structure ST may be formed on the support conductive pattern SP. The formation of the electrode structure ST may include vertically and alternately stacking the insulating layers ILD1 and ILD2 and the electrodes GE1 and GE2 to form a layered structure (not shown) and performing a trimming process on the layered structure. The trimming process may include forming a mask pattern (not shown) on the cell array region CAR and the connection region CNR to cover a portion of a top surface of the layered structure, patterning the layered structure using the mask pattern as a patterning mask, reducing an area of the mask pattern, and patterning the layered structure using the mask pattern with the reduced area as a patterning mask. In an example embodiment, the steps of reducing the area of the mask pattern and patterning the layered structure using the mask pattern may be alternately repeated several times during the trimming process. As a result of the trimming process, the electrode structure ST may have a stepwise structure on the connection region CNR.

The electrodes GE1 and GE2 may be formed of or include a doped semiconductor material (e.g., doped silicon). The insulating layers ILD1 and ILD2 may include a silicon oxide layer and/or a low-k dielectric layer.

According to a conventional technology, the electrodes may be formed of a metallic material. As an example, the formation of the electrodes may include a step of vertically and alternatingly forming insulating layers and sacrificial layers, which are formed of insulating materials, and a step of replacing the sacrificial layers with metal layers. However, if the sacrificial layer is thin, pores or voids may be produced in the metal layer during the replacement step, and by-products, which are produced in a fabrication process, may be left in the pores or voids. The by-products may cause a damage of other elements in a subsequent process.

In contrast, according to an example embodiment of the inventive concepts, the electrodes GE1 and GE2 may be formed of or include a doped semiconductor material. Thus, the electrodes GE1 and GE2 may be formed without the sacrificial layer, and thus, it may be possible to omit the replacement process. Accordingly, it may be possible to mitigate or prevent pores or voids from being produced in the electrodes GE1 and GE2 in a subsequent process and thereby to improve reliability of the semiconductor device. Furthermore, due to the omission of the replacement process, the fabrication process may be more easily performed.

The planarization insulating layer 120 may be formed to cover the staircase structure of the electrode structure ST. The formation of the planarization insulating layer 120 may include forming a preliminary planarization insulating layer (not shown) on the electrode structure ST and performing a planarization process on the preliminary planarization insulating layer to expose a top surface of the uppermost one of the second insulating layers ILD2.

In the cell array region CAR, the vertical channel holes CHH may be formed to penetrate the electrode structure ST, the support conductive pattern SP, and the first to third dummy insulating layers 101, 103, and 105. The vertical channel holes CHH may be extended in an opposite direction of the third direction D3 to further penetrate a portion of the semiconductor layer 100.

In the connection region CNR, the first penetration holes PH1 may be formed to penetrate the planarization insulating layer 120, the electrode structure ST, the penetration insulating pattern 111, the second lower insulating layer 55, and the etch stop layer 53.

In the connection region CNR, the second penetration holes PH2 may be formed to penetrate the planarization insulating layer 120. The second penetration holes PH2 may be extended in the opposite direction of the third direction D3 to further penetrate a portion of the semiconductor layer 100.

In the connection region CNR, the dummy holes DH may be formed to penetrate the planarization insulating layer 120, the electrode structure ST, the support conductive pattern SP, and the first to third dummy insulating layers 101, 103, and 105. The dummy holes DH may be extended in the opposite direction of the third direction D3 to further penetrate a portion of the semiconductor layer 100.

Figure 12A:
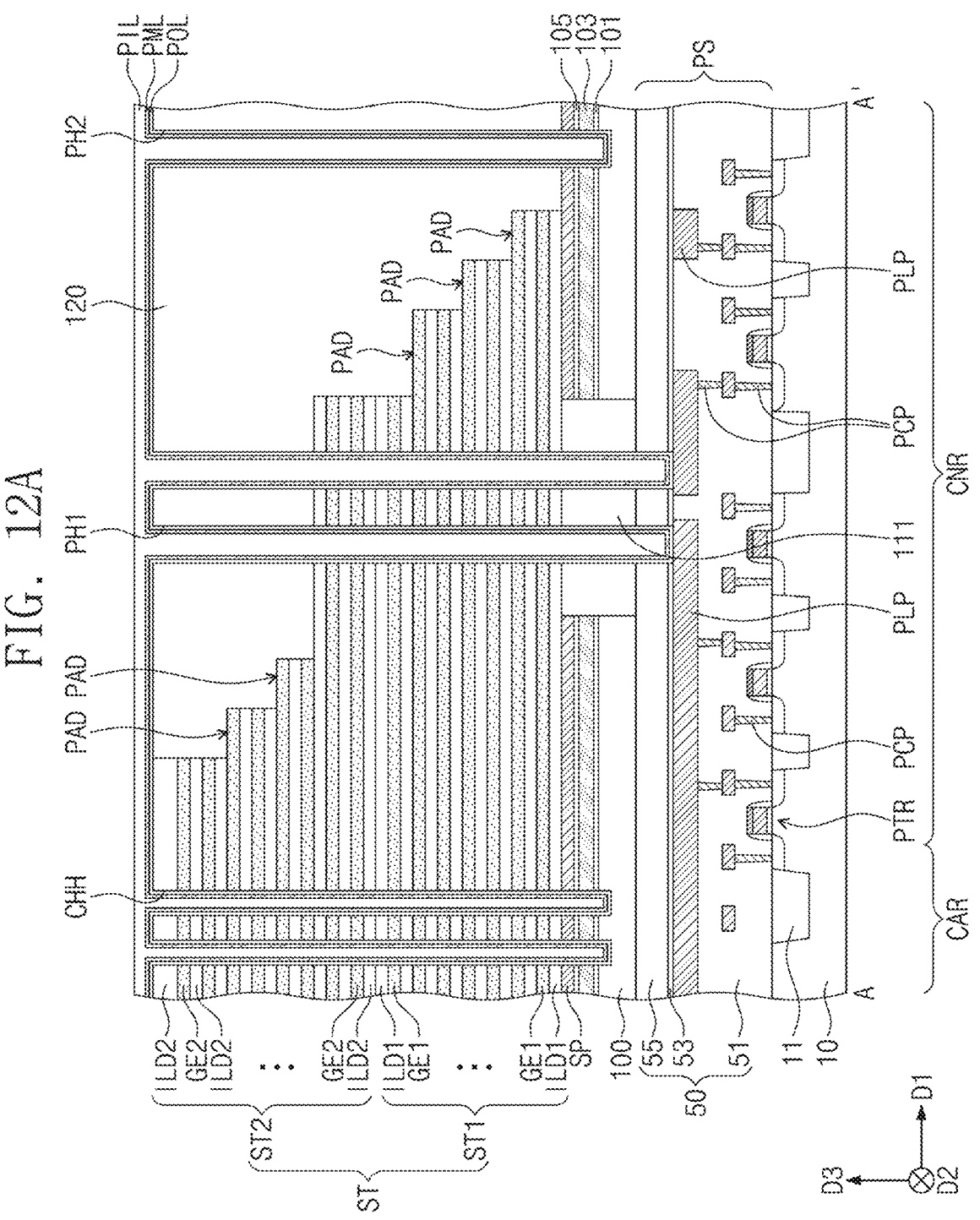
Figure 12B:
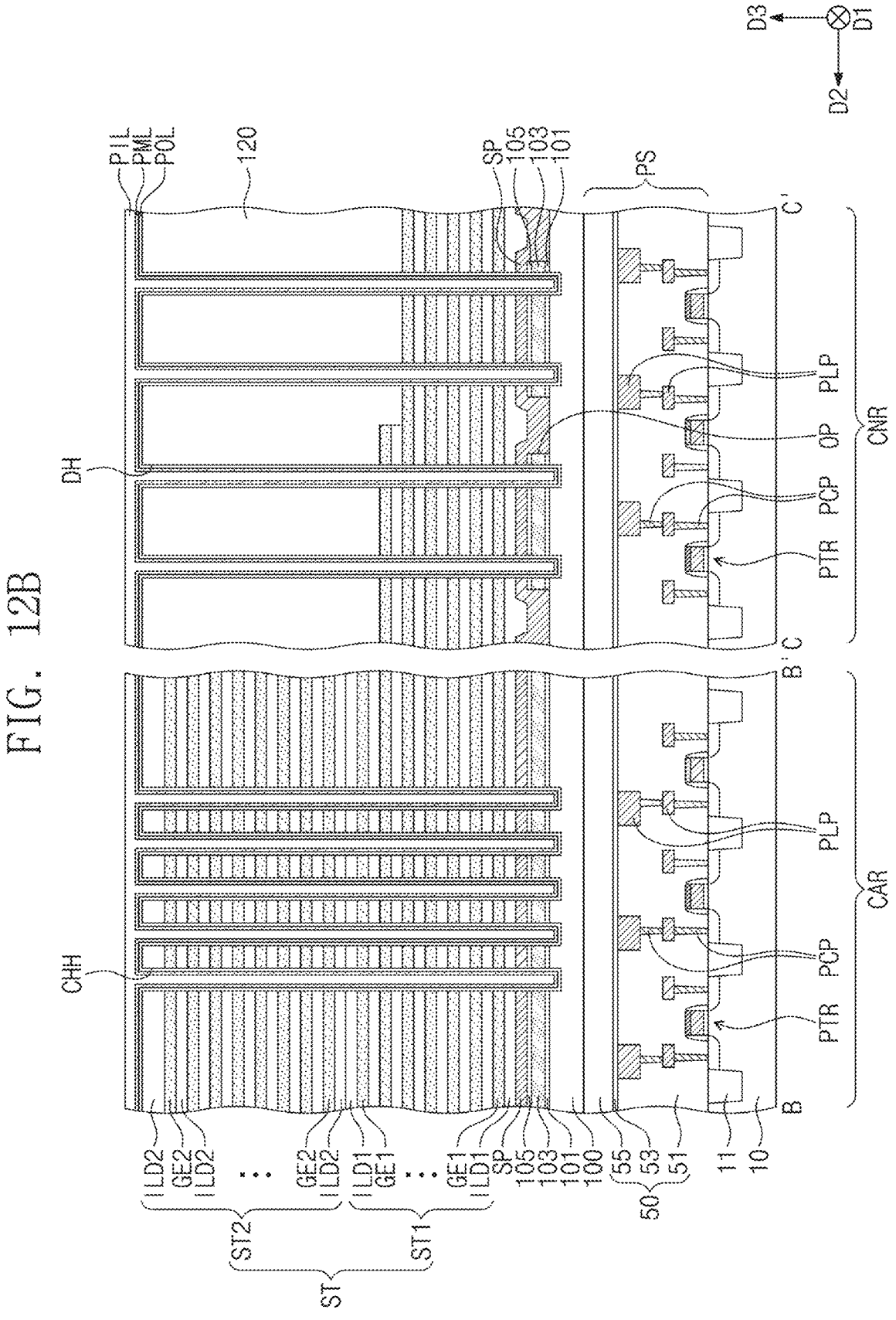

Referring to FIGS. 12A and 12B, a preliminary outer layer POL, a preliminary intermediate layer PML, and a preliminary inner layer PIL may be formed. The preliminary outer layer POL may be provided to cover inner side surfaces and bottom surfaces of the vertical channel holes CHH, the first penetration holes PH1, the second penetration holes PH2, and the dummy holes DH and to cover a top surface of the electrode structure ST and a top surface of the planarization insulating layer 120. The preliminary intermediate layer PML may be provided on the preliminary outer layer POL to cover the preliminary outer layer POL. The preliminary inner layer PIL may be provided on the preliminary intermediate layer PML to cover the preliminary intermediate layer PML. The uppermost surface of the preliminary inner layer PIL may be higher than the uppermost surface of the preliminary inner layer PIL and the uppermost surface of the preliminary intermediate layer PML.

The preliminary outer layer POL and the preliminary intermediate layer PML may be deposited using a chemical vapor deposition (CVD) or atomic layer deposition (ALD) method to have a uniform thickness on the inner side surfaces and the bottom surfaces of the vertical channel holes CHH, the first penetration holes PH1, the second penetration holes PH2, and the dummy holes DH.

Figure 13A:
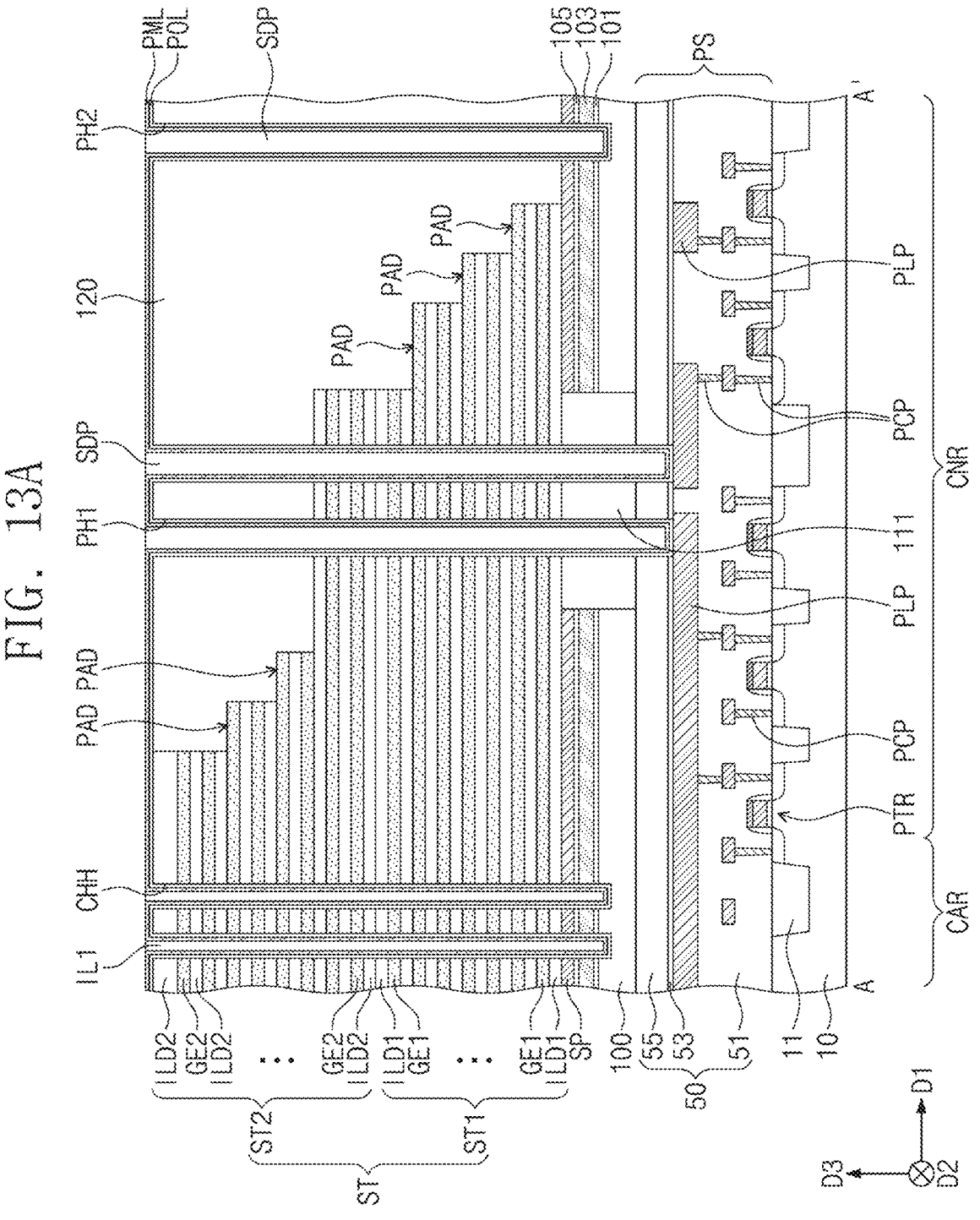
Figure 13B:
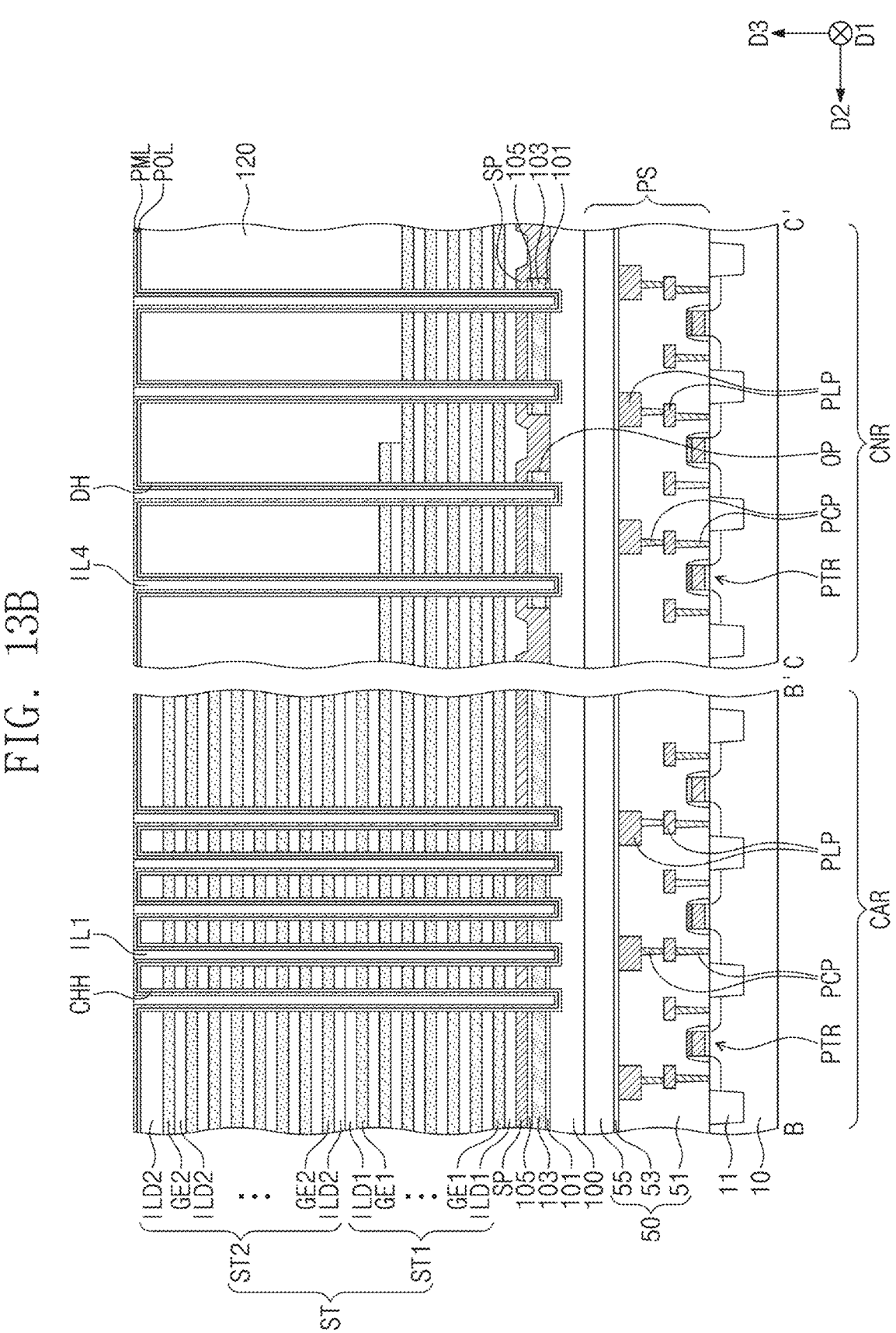

Referring to FIGS. 13A and 13B, a planarization process may be performed on the preliminary inner layer PIL of FIGS. 12A and 12B. The planarization process may be performed to expose the uppermost surface of the preliminary intermediate layer PML. The planarization process may be performed using a chemical mechanical polishing (CMP) process. As a result of the planarization process, the first inner layer IL1 may be formed in the vertical channel holes CHH. As a result of the planarization process, a sacrificial insulating pattern SDP may be formed in each of the first penetration holes PH1 and the second penetration holes PH2. As a result of the planarization process, the fourth inner layer IL4 may be formed in the dummy holes DH.

Figure 14A:
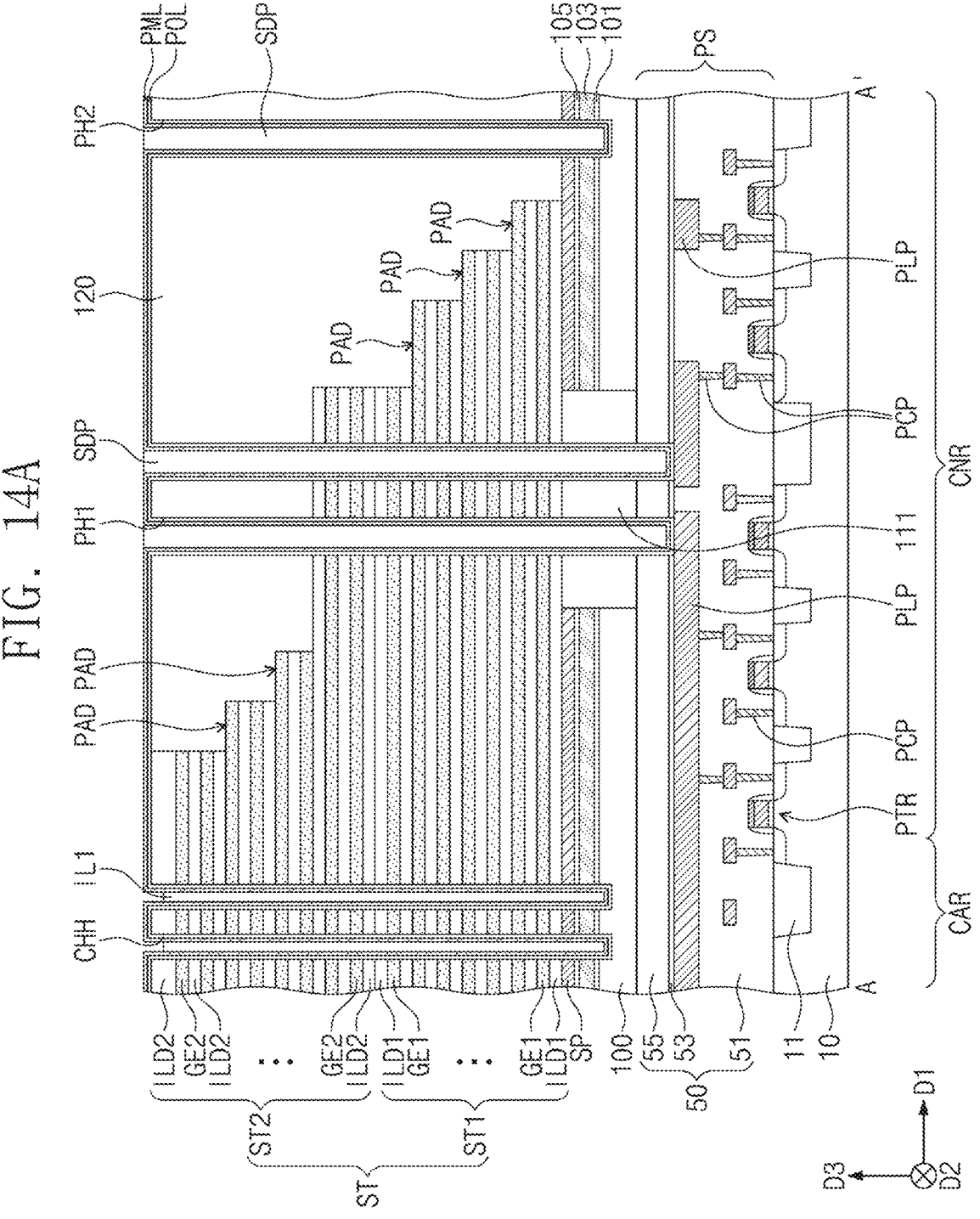
Figure 14B:
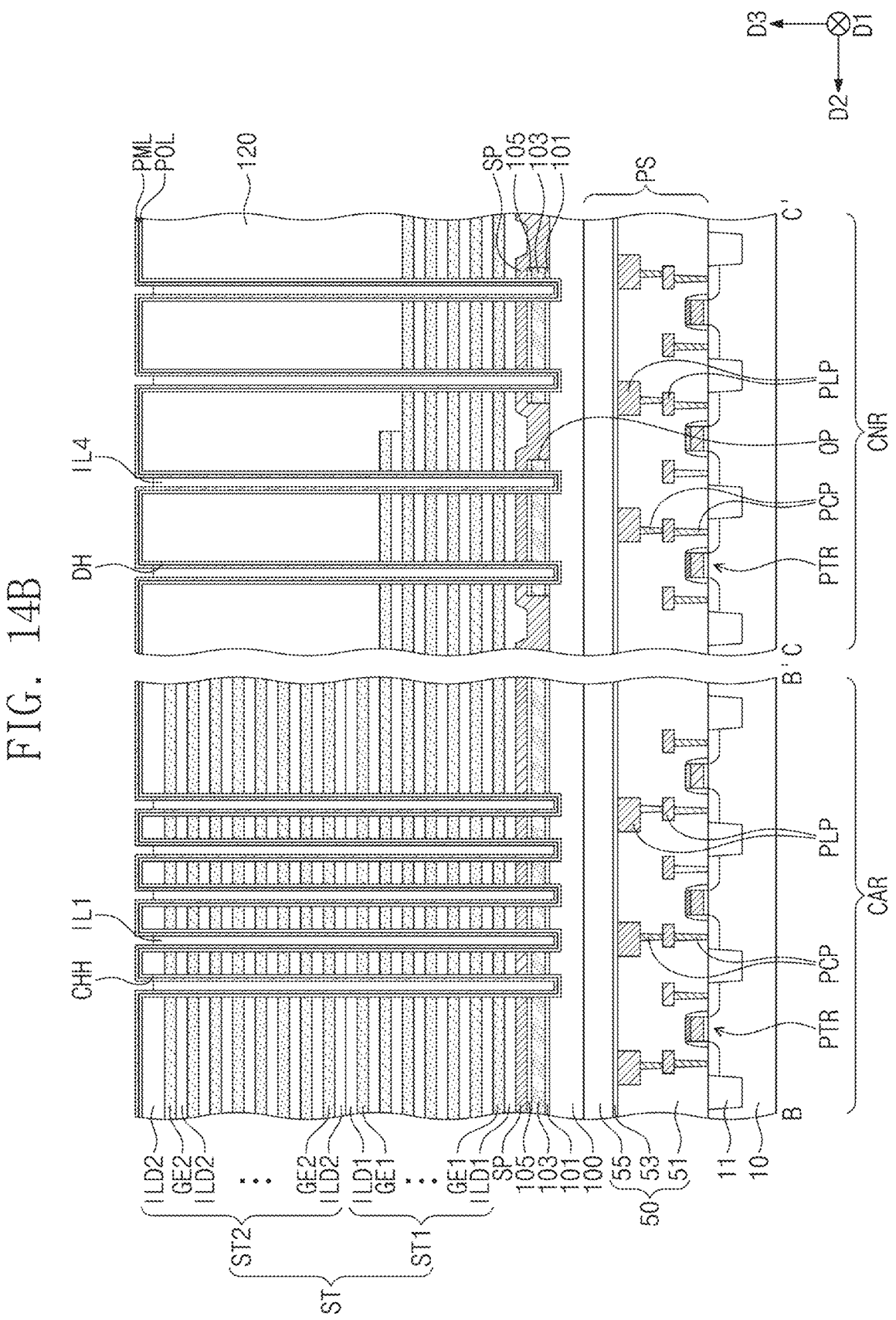

Referring to FIGS. 14A and 14B, an etch-back process may be performed on the first inner layer IL1 and the fourth inner layer IL4. The etch-back process may be performed forming a mask pattern (not shown) exposing the vertical channel holes CHH and the dummy holes DH and anisotropically etching a portion of the first inner layer IL1 and a portion of the fourth inner layer IL4 using the mask pattern as an etch mask. As a result of the etch-back process, the first and fourth inner layers IL1 and IL4 may be partially removed to have lowered top surfaces.

Figure 15A:
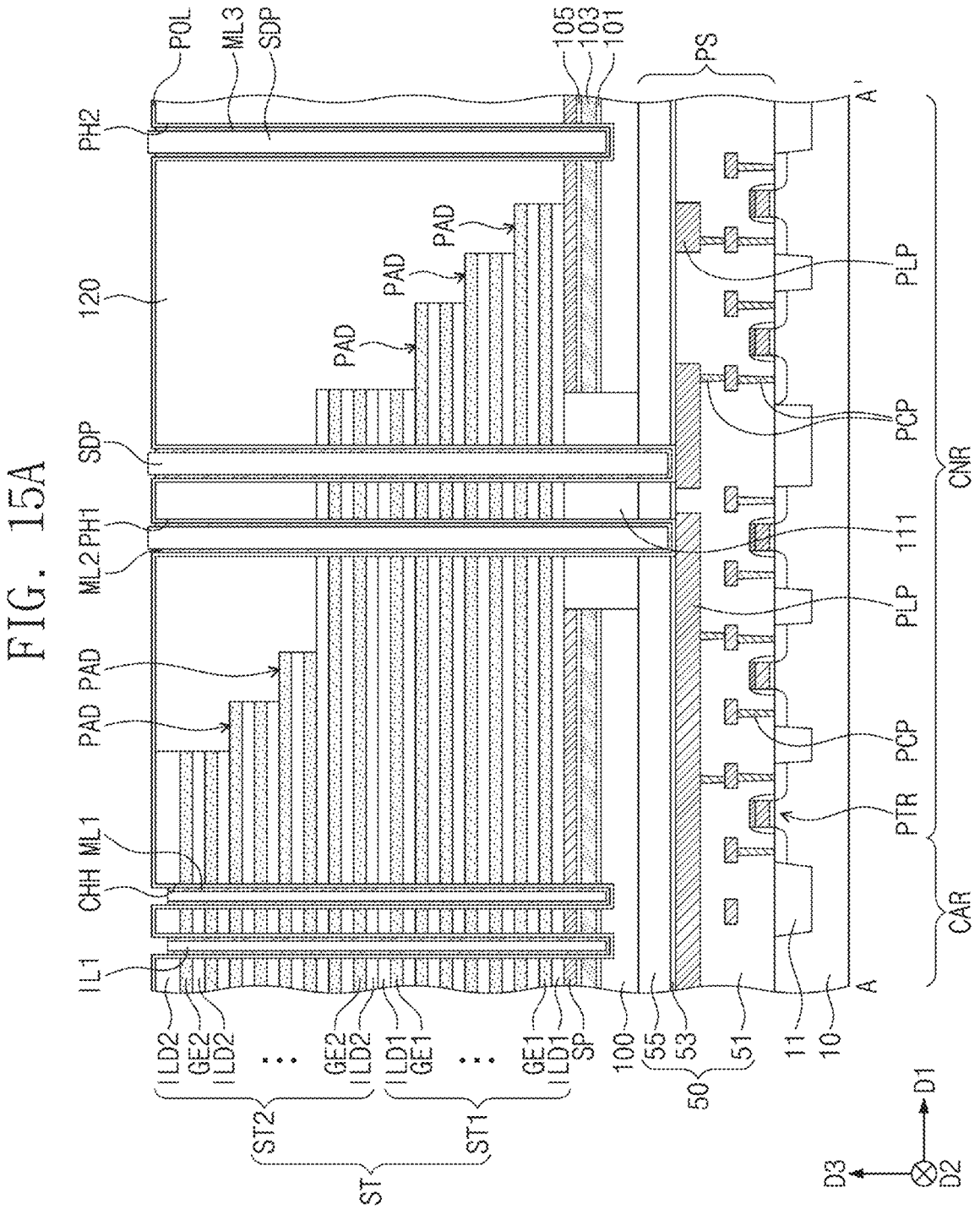
Figure 15B:
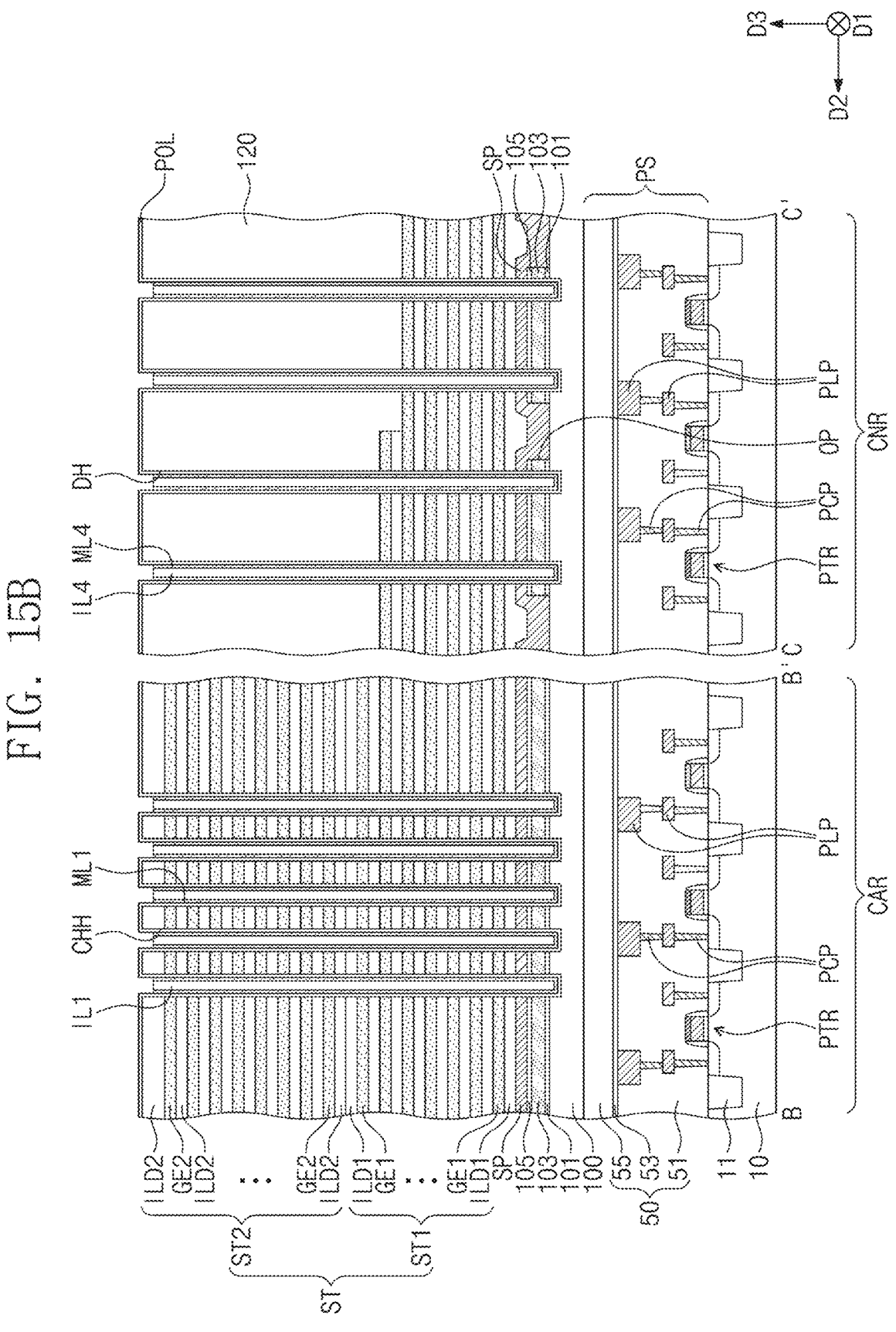

Referring to FIGS. 15A and 15B, an isotropic etching process may be performed on the preliminary intermediate layer PML of FIGS. 14A and 14B. A portion of the preliminary intermediate layer PML may be etched by the isotropic etching process.

As a result of the isotropic etching process, the first intermediate layer ML1 may be formed in the vertical channel holes CHH. As a result of the isotropic etching process, the second intermediate layer ML2 may be formed in each of the first penetration holes PH1. As a result of the isotropic etching process, the third intermediate layer ML3 may be formed in each of the second penetration holes PH2. As a result of the isotropic etching process, the fourth intermediate layer ML4 may be formed in the dummy holes DH.

Figure 16A:
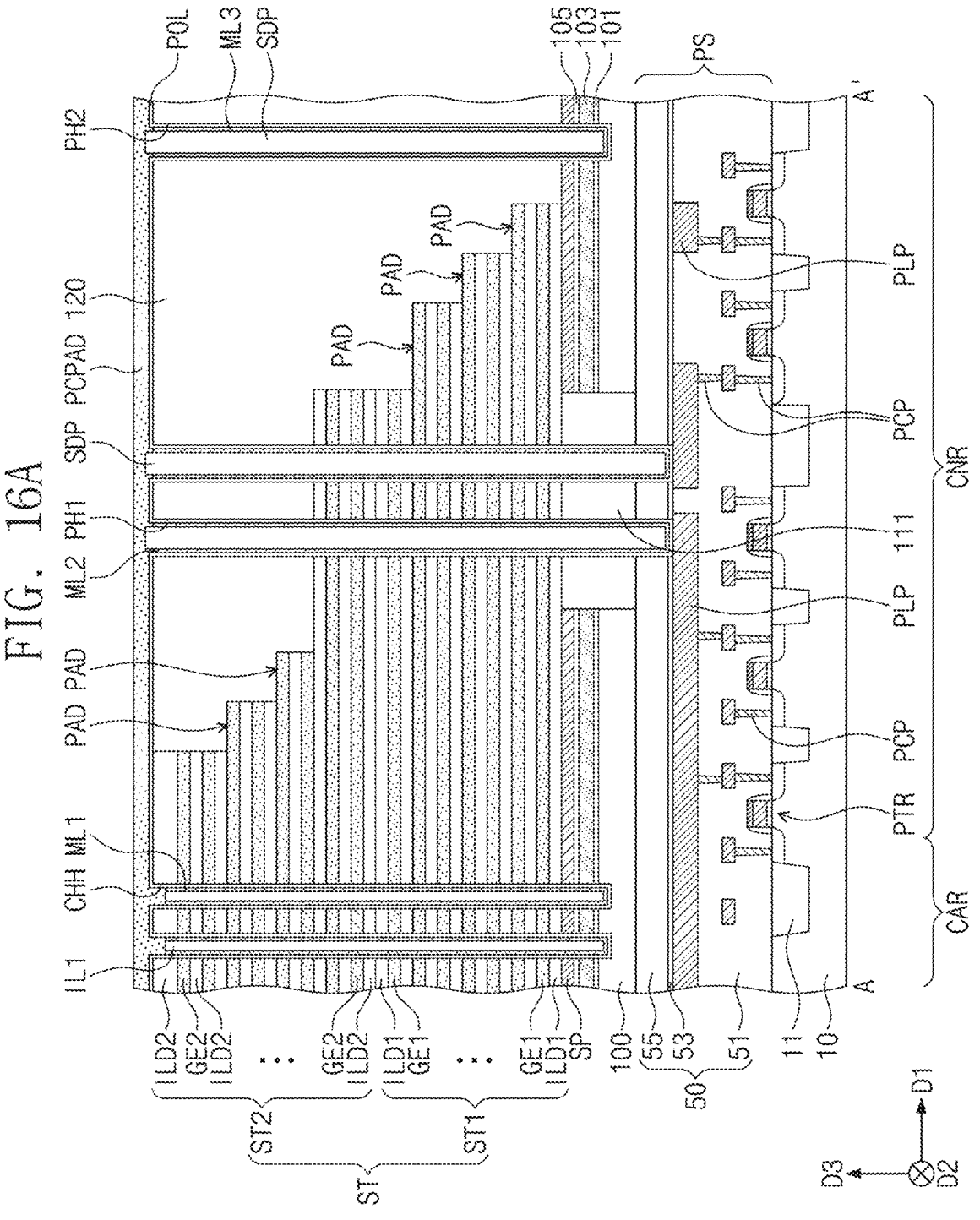
Figure 16B:
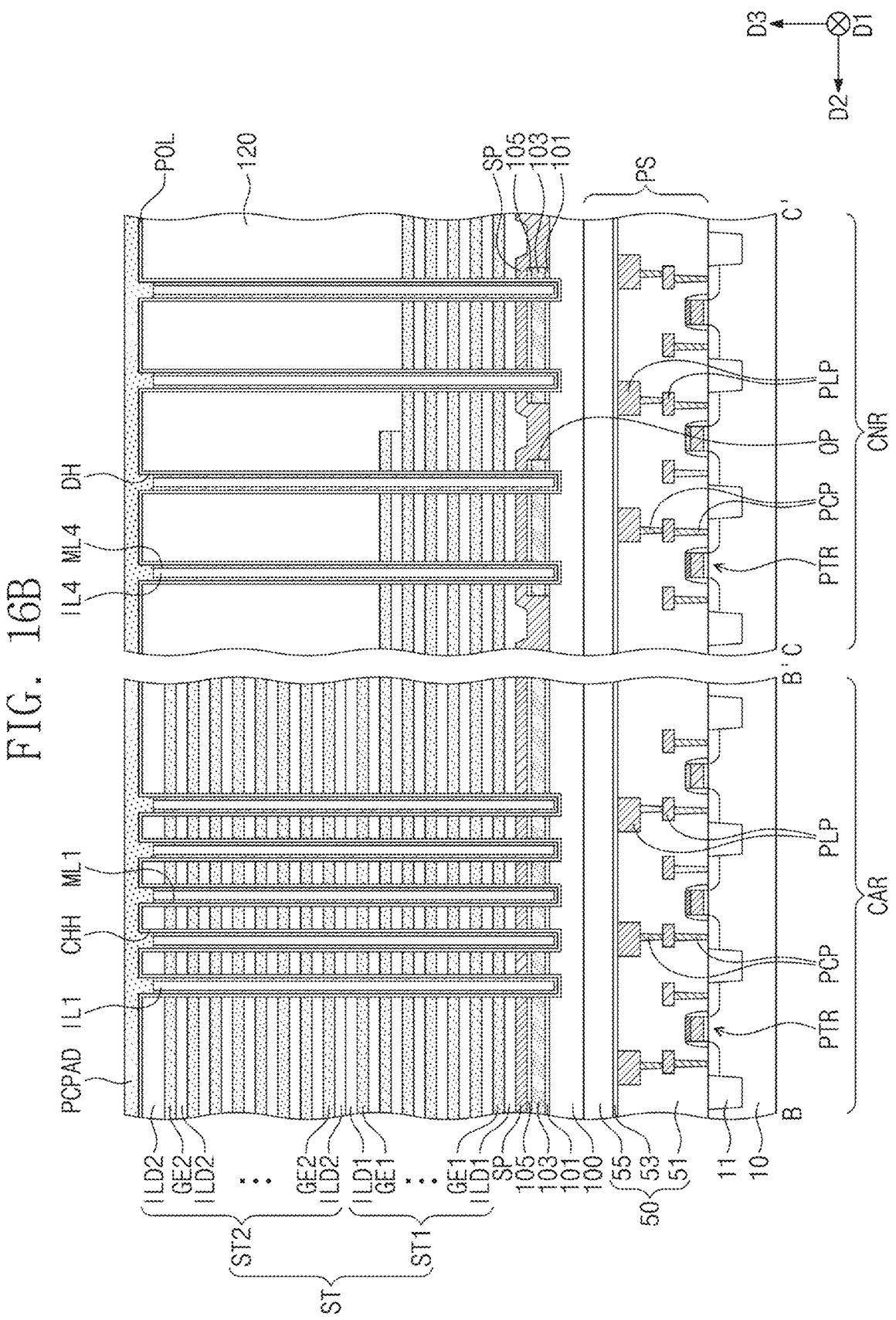

Referring to FIGS. 16A and 16B, a preliminary conductive pad layer PCPAD may be formed on the electrode structure ST and the planarization insulating layer 120. The preliminary conductive pad layer PCPAD may be formed using a chemical vapor deposition (CVD) method, a physical vapor deposition (PVD) method, or an atomic layer deposition (ALD) method. The preliminary conductive pad layer PCPAD may cover the uppermost surface of the preliminary outer layer POL. The preliminary conductive pad layer PCPAD may cover the top surfaces of the first inner layer IL1, the first intermediate layer ML1, the sacrificial insulating pattern SDP, the second intermediate layer ML2, the third intermediate layer ML3, the fourth inner layer IL4, and the fourth intermediate layer ML4.

Figure 17A:
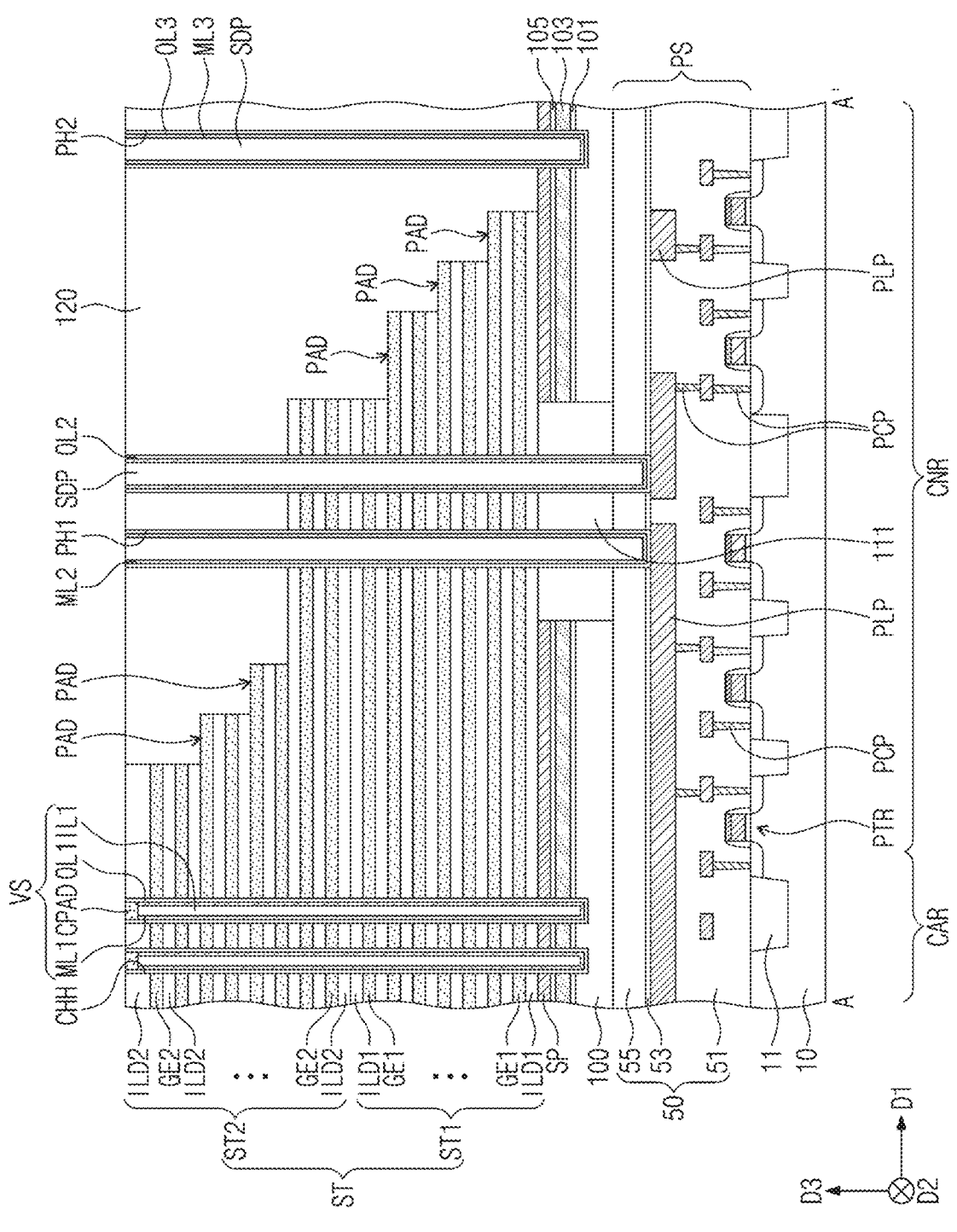
Figure 17B:
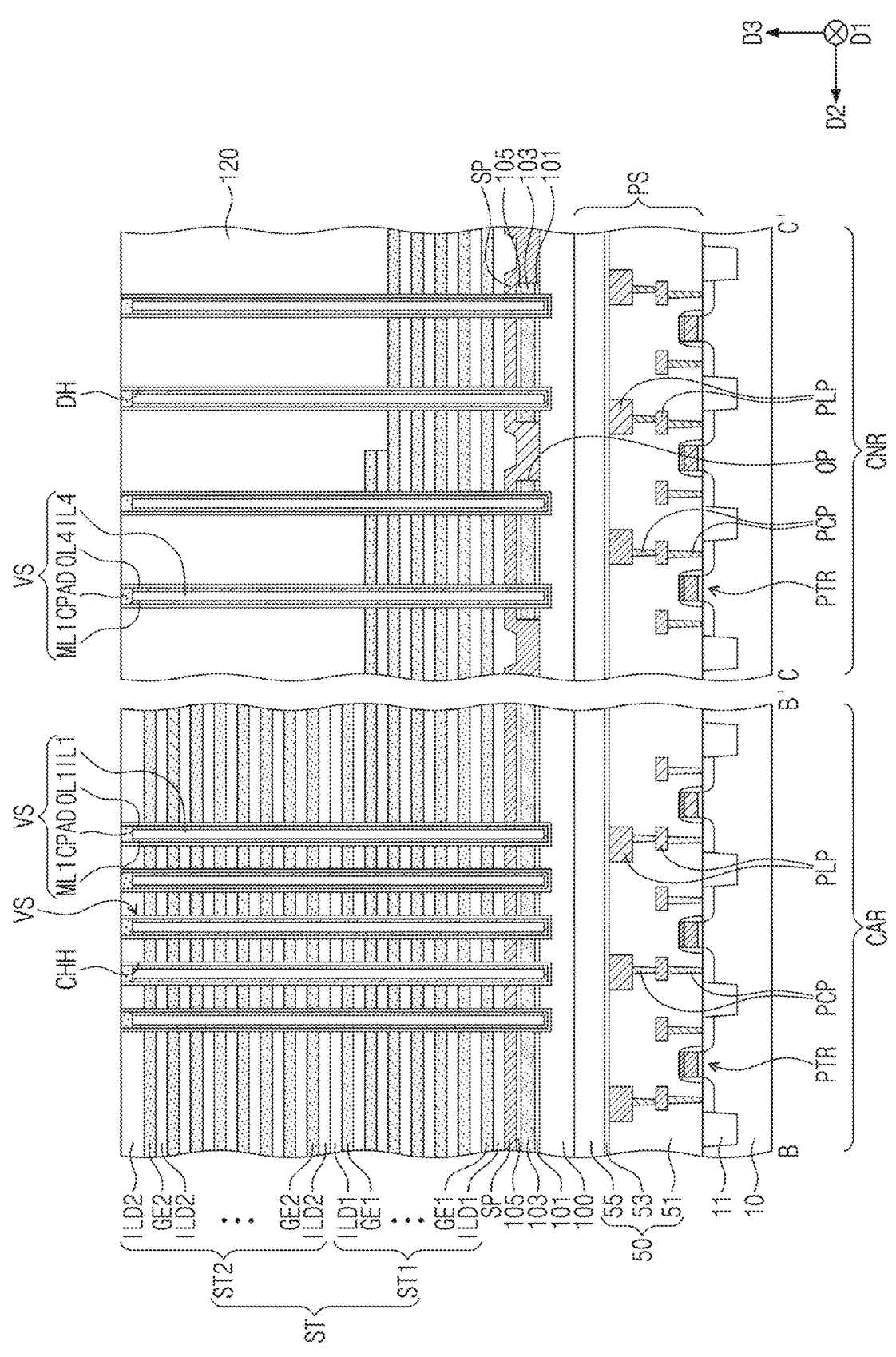

Referring to FIGS. 17A and 17B, a planarization process may be performed on the preliminary conductive pad layer PCPAD of FIGS. 16A and 16B to form the conductive pads CPAD. The planarization process may be performed to expose the top surface of the electrode structure ST and the top surface of the planarization insulating layer 120. A portion of the preliminary outer layer POL may be removed by the planarization process. As a result of the planarization process, the first outer layer OL1 may be formed in the vertical channel holes CHH. As a result of the planarization process, the second outer layer OL2 may be formed in the first penetration holes PH1. As a result of the planarization process, the third outer layer OL3 may be formed in second penetration holes PH2. As a result of the planarization process, the fourth outer layer OL4 may be formed in the dummy holes DH. Thus, the vertical structures VS and the dummy vertical structures DVS may be formed.

The first to fourth outer layers OL1, OL2, OL3, and OL4 and the conductive pad CPAD may be top surfaces that are substantially coplanar with each other.

Figure 18A:
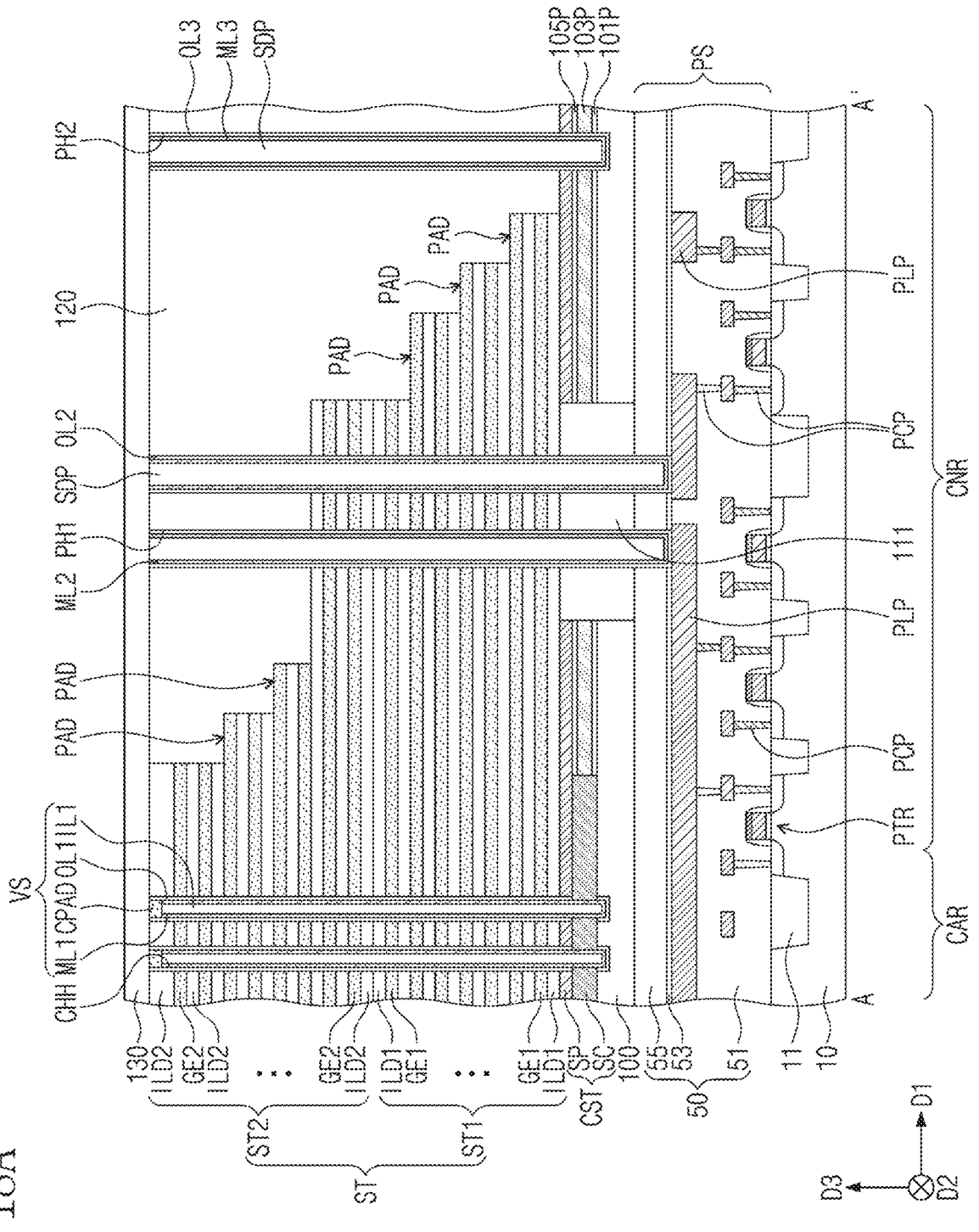
Figure 18B:
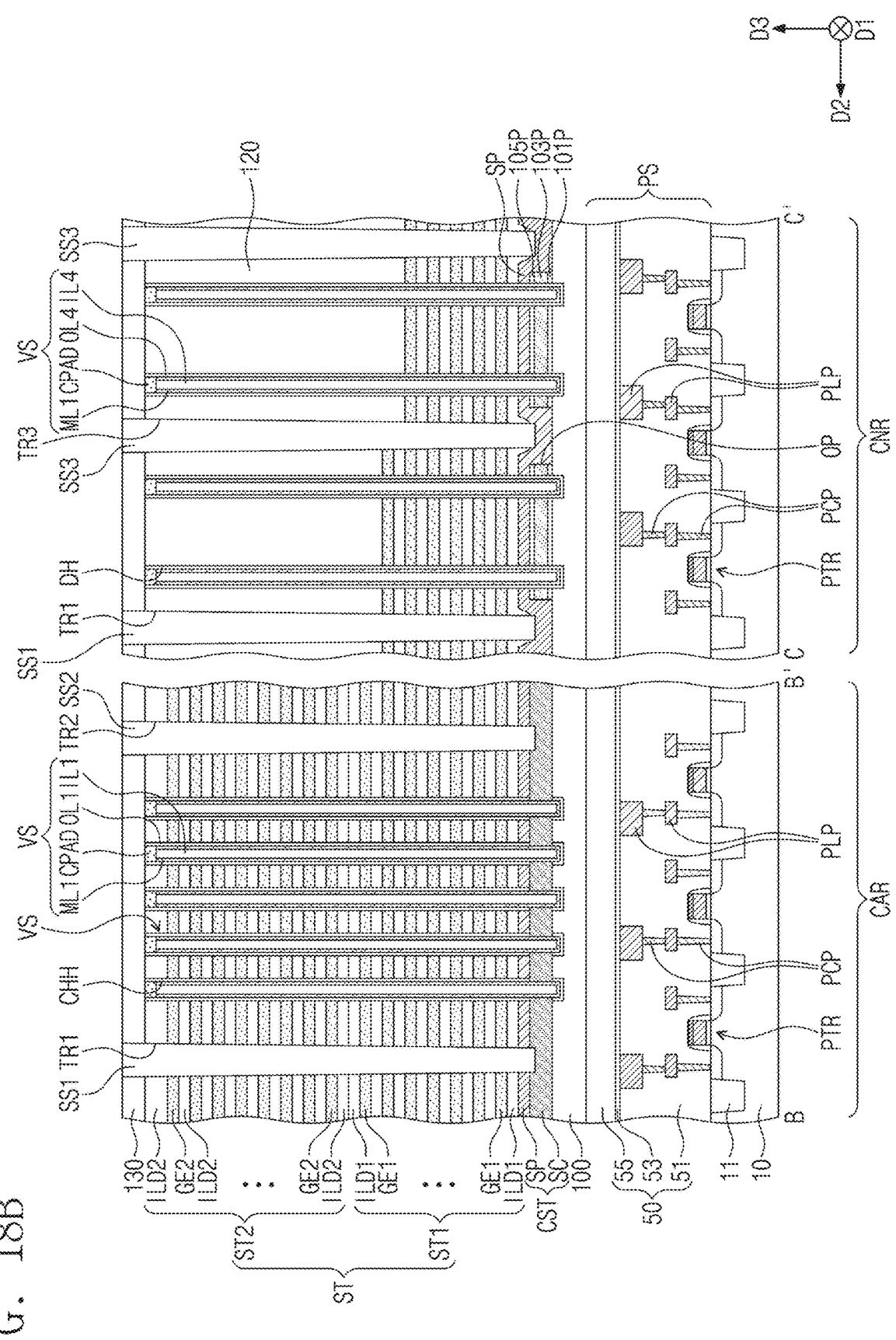

Referring to FIGS. 18A and 18B, the first interlayer insulating layer 130 may be formed on the electrode structure ST and the planarization insulating layer 120.

After the formation of the first interlayer insulating layer 130, a first separation trench TR1, a second separation trench TR2, and a third separation trench TR3 may be formed to penetrate the electrode structure ST and expose the support conductive pattern SP. The first to third separation trenches TR1, TR2, and TR3 may be formed by anisotropically etching the first interlayer insulating layer 130, the planarization insulating layer 120, and the electrode structure ST. The first to third separation trenches TR1, TR2, and TR3 may further penetrate the third dummy insulating layer 105 and may be inserted into the second dummy insulating layer 103. The first to third separation trenches TR1, TR2, and TR3 may have bottom surfaces that are located between top and bottom surfaces of the second dummy insulating layer 103.

The first to third separation trenches TR1, TR2, and TR3 may be extended in the first direction D1. The first separation trenches TR1 may be extended from the cell array region CAR to the connection region CNR in the first direction D1. The second separation trenches TR2 may be extended from the cell array region CAR to the connection region CNR in the first direction D1 and may be shorter than the first separation trenches TR1. The third separation trenches TR3 may be spaced apart from the first and second separation trenches TR1 and TR2 in at least one of the first and second direction D1 and D2 in the connection region CNR and may be extended in the first direction D1.

After the formation of the first to third separation trenches TR1, TR2, and TR3, the first, second, and third dummy insulating layers 101, 103, and 105 in the cell array region CAR may be replaced with the source conductive pattern SC.

The formation of the source conductive pattern SC may include performing an isotropic etching process on the second dummy insulating layer 103 exposed through the first and second separation trenches TR1 and TR2 and then performing an isotropic etching process on the first and third dummy insulating layers 101 and 105. During the isotropic etching process, the first outer layer OL1 may be partially removed to expose a portion of the first intermediate layer ML1. After partially exposing the first intermediate layer ML1, a doped poly silicon layer may be deposited to form the source conductive pattern SC. Accordingly, the source structure CST may be formed between the semiconductor layer 100 and the electrode structure ST.

Due to the openings OP, etching solution, which is supplied in the isotropic etching process, may not reach the first to third dummy insulating layers 101, 103, and 105 in the connection region CNR. Thus, the first to third dummy insulating layers 101, 103, and 105 may not be removed from the connection region CNR. The remaining portions of the first to third dummy insulating layers 101, 103, and 105, which are not removed from the connection region CNR, may form the first to third insulating patterns 101*p*, 103*p*, and 105*p*, respectively.

After the formation of the source structure CST, the first to third separation structures SS1, SS2, and SS3 may be formed by filling the first to third separation trenches TR1, TR2, and TR3 with an insulating material.

Figure 19A:
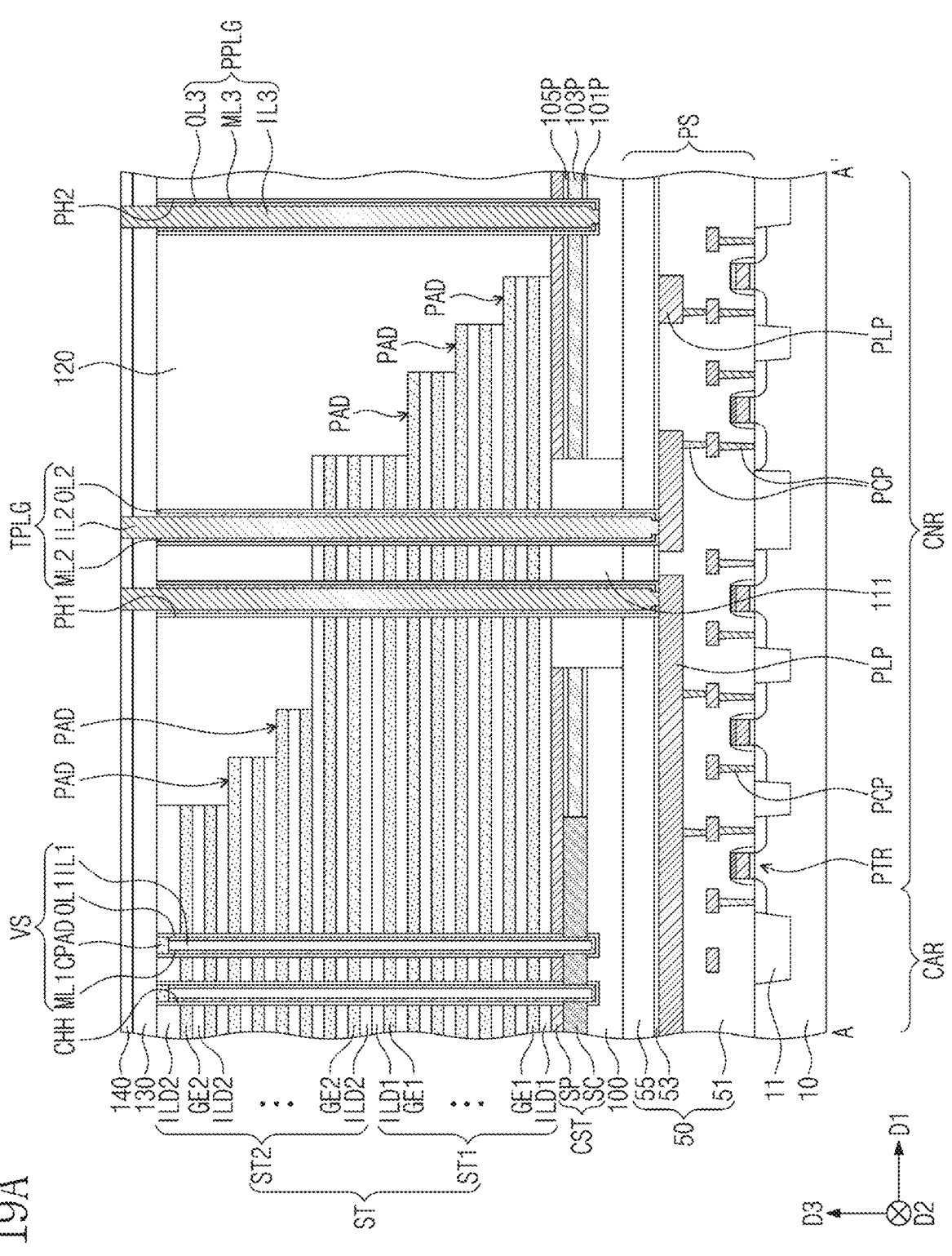
Figure 19B:
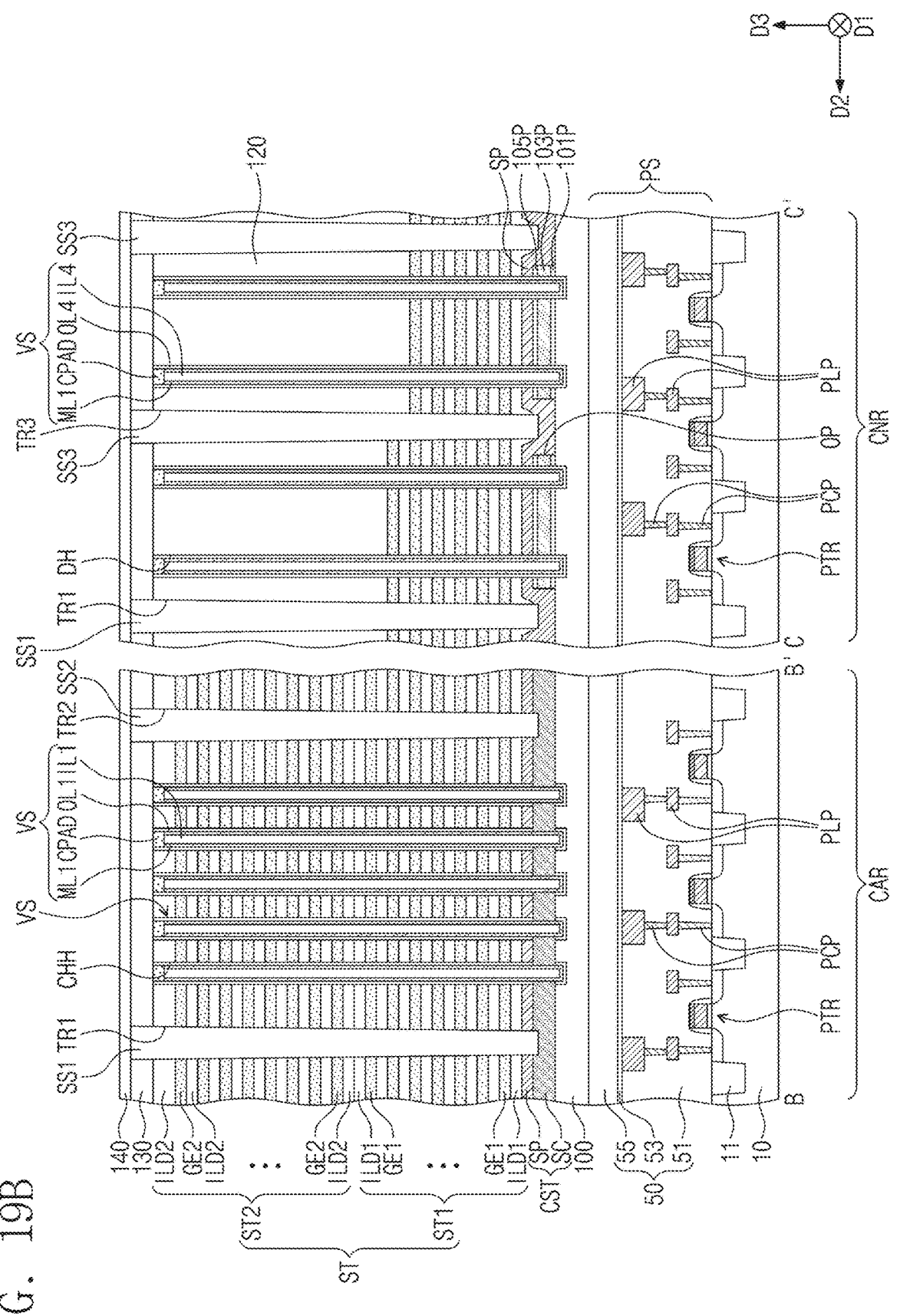

Referring to FIGS. 19A and 19B, the second interlayer insulating layer 140 may be formed to cover the first to third separation structures SS1, SS2, and SS3.

A mask pattern (not shown) may be formed on the second interlayer insulating layer 140, and an anisotropic etching process may be performed to expose a top surface of the sacrificial insulating pattern SDP. An etch-back process may be performed on the exposed top surface of the sacrificial insulating pattern SDP to remove the sacrificial insulating pattern SDP, and then, the second and third inner layers IL2 and IL3 may be formed in empty spaces, which are formed by removing the sacrificial insulating patterns SDP. Top surfaces of the second and third inner layers IL2 and IL3 may be coplanar with top surface of the second interlayer insulating layer 140. Thus, the penetration contact plugs TPLG and the peripheral contact plugs PPLG may be formed.

Referring back to FIGS. 6A and 6B, the third interlayer insulating layer 150 may be formed on the second interlayer insulating layer 140. The cell contact plugs CPLG may be formed to be respectively coupled to the pad portions PAD of the electrodes GE1 and GE2. The lower bit line contact plugs BCTa may be formed to be connected to the vertical structures VS. Each of the cell contact plugs CPLG and the lower bit line contact plugs BCTa may be formed of or include at least one of metallic materials and metal nitride materials.

The fourth interlayer insulating layer 160 may be formed on the third interlayer insulating layer 150. An upper bit line contact plug BTCb may be formed to be connected to the lower bit line contact plug BCTa. The contact plugs LCT may be formed to be connected to the cell contact plugs CPLG, the penetration contact plugs TPLG, and the peripheral contact plugs PPLG. The bit lines BL and the conductive lines CL may be formed on the fourth interlayer insulating layer 160. As a result, the semiconductor device may be fabricated.

According to an example embodiment of the inventive concepts, the second inner layer IL2 of the penetration contact plug TPLG may be spaced apart from the electrodes GE1 and GE2 by the second outer layer OL2 and the second intermediate layer ML2. Thus, even when an additional insulating structure (e.g., a DAM structure) is absent in the electrode structure ST, the penetration contact plug TPLG may be electrically disconnected from the electrodes GE1 and GE2. Thus, reliability of the semiconductor device may be improved.

The first outer layer OL1 and the first intermediate layer ML1 of the vertical structure VS may be formed of or include the same materials as the second outer layer OL2 and the second intermediate layer ML2 of the penetration contact plug TPLG. This is because the first and second inner layers IL1 and IL2 are formed from the preliminary inner layer PIL of FIGS. 12A and 12B and the first and second intermediate layers ML1 and ML2 are formed from the preliminary intermediate layer PML of FIGS. 12A and 12B. In this case, because the vertical structure VS and the penetration contact plug TPLG are not formed by independent processes, it may be possible to reduce the number of steps constituting the fabrication process of the semiconductor device. Thus, it may be possible to reduce technical difficulties in a process of fabricating a semiconductor device.

According to an example embodiment of the inventive concepts, a semiconductor device may include electrodes, which are formed of or include a doped semiconductor material. In this case, a sacrificial layer may not be needed in a process of forming the electrodes of the semiconductor device, and thus, it may be possible to omit a process of replacing the sacrificial layer with a metal layer. Accordingly, pores or voids may not be produced in the electrodes in a subsequent process, and thus, reliability of the semiconductor device may be improved.

In addition, because the replacement process is omitted, it may be possible to reduce technical difficulties in a process of fabricating a semiconductor device.

Furthermore, a penetration contact plug penetrating an electrode structure may include an inner layer, an outer layer enclosing the inner layer, and an intermediate layer interposed between the inner and outer layers. The inner layer of the penetration contact plug may be spaced apart from the electrodes by the outer layer and the intermediate layer. Thus, even when an additional insulating structure (e.g., a DAM structure) is absent in the electrode structure, the penetration contact plug may be electrically disconnected from the electrodes. Thus, reliability of the semiconductor device may be improved.

Any functional blocks shown in the figures and described above may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a semiconductor substrate; and
a cell array structure on the semiconductor substrate,
wherein the cell array structure comprises,
an electrode structure including electrodes and insulating layers, the electrodes and the insulating layers vertically and alternately stacked with each other on the semiconductor substrate,
a vertical structure penetrating the electrode structure, and
a penetration contact plug penetrating the electrode structure, and the penetration contact plug laterally spaced apart from the vertical structure,
wherein the vertical structure comprises a first inner layer, a first outer layer enclosing the first inner layer, and a first intermediate layer interposed between the first inner layer and the first outer layer,
wherein the penetration contact plug comprises a second inner layer, a second outer layer enclosing the second inner layer, and a second intermediate layer interposed between the second inner layer and the second outer layer,
wherein the electrodes comprise a doped semiconductor material,
wherein the first and second outer layers comprise a same material,
wherein the first and second intermediate layers comprise a same material, and
wherein the first and second inner layers comprise different materials from each other.

2. The semiconductor device of claim 1, wherein the first outer layer has a first width,
the second outer layer has a second width,
the first intermediate layer has a third width,
the second intermediate layer has a fourth width,
the first width is equal to the second width, and
the third width is equal to the fourth width.

3. The semiconductor device of claim 1, wherein
the first inner layer has a fifth width,
the second inner layer has a sixth width, and
the fifth width is different from the sixth width.

4. The semiconductor device of claim 1, wherein
the first inner layer comprises one of silicon oxide and silicon nitride, and
the second inner layer comprises a metallic material.

5. The semiconductor device of claim 1, wherein each of the first and second outer layers comprise a ferroelectric material.

6. The semiconductor device of claim 1, wherein
each of the first and second intermediate layers comprises a variable resistance layer and a channel layer enclosing the variable resistance layer, and
the channel layer comprises at least one of a doped semiconductor material, an intrinsic semiconductor material, and a polycrystalline semiconductor material.

7. The semiconductor device of claim 6, wherein the variable resistance layer comprises a transition metal oxide material.

8. The semiconductor device of claim 1, wherein a top surface of the second inner layer is higher than a top surface of the second intermediate layer and a top surface of the second outer layer.

9. The semiconductor device of claim 1, wherein a top surface of the second inner layer is higher than a top surface of the first inner layer.

10. The semiconductor device of claim 1, wherein the cell array structure further comprises:
a semiconductor layer interposed between the semiconductor substrate and the electrode structure;
a planarization insulating layer enclosing at least a portion of the electrode structure; and
a peripheral contact plug penetrating the planarization insulating layer and coupled to the semiconductor layer,
wherein the peripheral contact plug comprises a third inner layer, a third outer layer enclosing the third inner layer, and a third intermediate layer interposed between the third inner layer and the third outer layer,
wherein the third outer layer comprises a same material as the first outer layer,
wherein the third intermediate layer comprises a same material as the first intermediate layer, and
wherein the third inner layer comprises a material different from the first inner layer.

11. The semiconductor device of claim 10, wherein
the third intermediate layer is spaced apart from the semiconductor layer, and
the third inner layer is in contact with the semiconductor layer.

12. The semiconductor device of claim 1, further comprising:
a peripheral circuit line interposed between the semiconductor substrate and the cell array structure,
wherein the second inner layer is coupled to the peripheral circuit line.

13. A semiconductor device, comprising:
a semiconductor substrate including a cell array region and a connection region, the connection region extending from the cell array region;
a cell array structure on the semiconductor substrate; and
a peripheral circuit structure interposed between the semiconductor substrate and the cell array structure,
wherein the cell array structure comprises,
an electrode structure including electrodes and insulating layers, the electrodes and the insulating layers vertically and alternately stacked with each other on the peripheral circuit structure, each of the electrodes comprising a pad portion on the connection region,
a vertical structure in the cell array region and penetrating the electrode structure, and
a penetration contact plug in the connection region and penetrating the pad portion,
wherein the vertical structure comprises a first inner layer and a first outer layer enclosing the first inner layer, wherein the penetration contact plug comprises a second inner layer and a second outer layer enclosing the second inner layer, wherein the electrodes comprise a doped semiconductor material, wherein the first inner layer comprises an insulating material, wherein the second inner layer comprises a metallic material, wherein the first and second outer layers comprise a same material, and wherein the second outer layer is in contact with the electrodes.

14. The semiconductor device of claim 13, wherein the cell array structure further comprises:

a semiconductor layer interposed between the peripheral circuit structure and the electrode structure; and a penetration insulating pattern in the connection region and penetrating the semiconductor layer, wherein the penetration contact plug is in the penetration insulating pattern, when viewed in a plan view.

15. The semiconductor device of claim 14, wherein the cell array structure further comprises a source structure interposed between the electrode structure and the semiconductor layer, the vertical structure further comprises a first intermediate layer interposed between the first inner layer and the first outer layer, and the first intermediate layer is in contact with the source structure.

16. The semiconductor device of claim 15, wherein the first intermediate layer comprises a variable resistance layer and a channel layer enclosing the variable resistance layer, and the channel layer is in contact with the source structure.

17. The semiconductor device of claim 13, wherein the cell array structure further comprises a separation structure, the separation structure extending in a first direction in the cell array region and penetrating the electrode structure, and a top surface of the second inner layer is higher than a top surface of the separation structure.

18. The semiconductor device of claim 13, wherein the cell array structure further comprises:

a cell contact plug coupled to the pad portion of each of the electrodes; and dummy vertical structures penetrating the pad portion and surrounding the cell contact plug, wherein each of the dummy vertical structures comprises a third inner layer and a third outer layer enclosing the third inner layer, the third inner layer comprises a same material as the first inner layer, and the third outer layer comprises a same material as the first outer layer.

19. An electronic system, comprising:

a three-dimensional semiconductor memory device comprising a semiconductor substrate, the semiconductor substrate including a cell array region and a connection region extended from the cell array region, a peripheral circuit structure on the semiconductor substrate, a cell array structure on the peripheral circuit structure, an insulating layer covering the cell array structure, and an input/output pad provided on the insulating layer and electrically connected to the peripheral circuit structure; and a controller electrically connected to the three-dimensional semiconductor memory device through the input/output pad and configured to control the three-dimensional semiconductor memory device, wherein the cell array structure comprises, an electrode structure including electrodes and insulating layers, the electrodes and the insulating layers vertically and alternately stacked with each other on the peripheral circuit structure, a vertical structure penetrating the electrode structure, and a penetration contact plug penetrating the electrode structure, and the penetration contact plug laterally spaced apart from the vertical structure, wherein the vertical structure comprises a first inner layer, a first outer layer enclosing the first inner layer, and a first intermediate layer interposed between the first inner layer and the first outer layer, wherein the penetration contact plug comprises a second inner layer, a second outer layer enclosing the second inner layer, and a second intermediate layer interposed between the second inner layer and the second outer layer, wherein the electrodes comprise a doped semiconductor material, wherein the first and second outer layers comprise a same material, wherein the first and second intermediate layers comprise a same material, and wherein the first and second inner layers comprise different materials from each other.

20. The electronic system of claim 19, wherein the second outer layer is in contact with the electrodes, and the second inner layer is spaced apart from the electrodes.

* * * * *